(12) United States Patent
Huang et al.

(10) Patent No.: US 11,329,394 B2
(45) Date of Patent: May 10, 2022

(54) FLEXIBLE ANTENNA STRUCTURE AND ELECTRONIC DEVICE

(71) Applicant: Etheta Communication Technology (Shenzhen) Co., Ltd., Shenzhen (CN)

(72) Inventors: Huan-Chu Huang, Taoyuan (CN); Dasong Gao, Shenzhen (CN); Zhixing Qi, Shenzhen (CN); Hong Lin, Shenzhen (CN); Yanchao Zhou, Shenzhen (CN)

( * ) Notice: Subject to any disclaimer, the term of this patent is extended or adjusted under 35 U.S.C. 154(b) by 0 days.

(21) Appl. No.: 17/504,550

(22) Filed: Oct. 19, 2021

(65) Prior Publication Data
US 2022/0037800 A1 Feb. 3, 2022

(30) Foreign Application Priority Data

Sep. 28, 2021 (CN) .......................... 202111140115.7

(51) Int. Cl.
*H01Q 21/06* (2006.01)
*H05K 1/02* (2006.01)

(52) U.S. Cl.
CPC ......... *H01Q 21/061* (2013.01); *H05K 1/0243* (2013.01); *H05K 1/0277* (2013.01); *H05K 2201/10098* (2013.01)

(58) Field of Classification Search
CPC ................ H01Q 21/061–065; H01Q 1/22–38
See application file for complete search history.

(56) References Cited

U.S. PATENT DOCUMENTS

| | | | |
|---|---|---|---|
| 2008/0012786 A1 | 1/2008 | Yang | |
| 2011/0169699 A1 | 7/2011 | Huang | |
| 2020/0021015 A1 | 1/2020 | Yun et al. | |
| 2020/0358203 A1* | 11/2020 | Park | H01Q 9/045 |
| 2021/0007213 A1* | 1/2021 | Ryu | H01Q 21/08 |
| 2021/0066788 A1* | 3/2021 | Kim | H01Q 1/48 |
| 2021/0305694 A1* | 9/2021 | Kim | H01Q 25/005 |

\* cited by examiner

*Primary Examiner* — Hasan Z Islam

(57) ABSTRACT

The present disclosure discloses a flexible antenna structure and an electronic device having the same. The flexible antenna structure includes a flexible printed circuit board, a mm-Wave antenna disposed on the flexible printed circuit board and conformal with the flexible printed circuit board, and a non-mm-Wave antenna disposed on the flexible printed circuit board and conformal with the flexible printed circuit board. Compared with the existing art, by means of the flexible antenna structure provided with the mm-Wave antenna and the non-mm-Wave antenna on the flexible printed circuit board, the present disclosure realizes integration of the mm-Wave antenna and the non-mm-Wave antenna, solves a challenge of numerous antennas in the electronic device, and realizes conformation with a bent part of a shell 1, thereby increasing the space utilization rate in a limited space. Furthermore, the overall size and cost cannot be increased, thus improving the competitiveness of a product.

13 Claims, 38 Drawing Sheets

FLEXIBLE ANTENNA STRUCTURE AND ELECTRONIC DEVICE

TECHNICAL FIELD

The present disclosure relates to the technical field of antennas, and particularly relates to a flexible antenna structure and an electronic device having the same.

BACKGROUND

With the advent of the 5G era, communication requirements of higher-order multi-input and multi-output (MIMO), coverage requirements of more new frequency bands, and even addition of millimeter-wave (mm-Wave) bands have led to a need of an electronic device such as a mobile phone for having more antennas (i.e., including mm-Wave and non-mm-Wave antennas). If the whole space cannot be significantly enlarged, higher antenna design difficulty will be caused, and even the production competitiveness is caused because of increase in the overall size due to less compact antenna placement or design. A 5G frequency band is divided into a mm-Wave band and a non-mm-Wave band. A current mainstream antenna for the non-mm-Wave band is designed to be a discrete antenna. Mainstream implementation methods include stamped iron sheets, flexible printed circuits (FPC), laser direct structuring (LDS), printed direct structuring (PDS), etc.; and a current mainstream antenna for the mm-Wave band is designed to be an integrated antenna-in-package (AiP), that is, an antenna and a chip (especially a radio-frequency integrated circuit (RFIC)) are integrated into an AiP module. As mentioned earlier, the number of antennas in the 5G era has increased significantly, so a plurality of discrete 5G non-mm-Wave antennas and several 5G mm-Wave antenna modules are required in a 5G device (if the device can support mm-Wave communication).

In view of the above-mentioned problems related to the increasing number of antennas, the existing art <CN 111,430,942 B> provides integrating a mm-Wave antenna and a non-mm-Wave antenna in the same module. However, mobile phones and other electronic devices are quite aspiring and exquisite for their visual thicknesses, grip thicknesses, and shapes, so sides of their shells are mostly of an arc-shaped design to present a thinner visual thickness and grip thickness and a more competitive appearance. Therefore, for multiple and various kinds of antennas (including mm-Wave and non-mm-Wave antennas) in mobile phones and other electronic devices, how to be conformal with an are shell and how to achieve better antenna placement in an internal system to achieve a better design solution for the space utilization rate in a limited space are critical and serious issues now and in the future. Furthermore, the two issues are challenges that cannot be overcome in the existing art <CN 111,430,942 B>.

SUMMARY

In view of this, it is necessary to provide a flexible antenna structure and an electronic device to improve the above-mentioned problems.

In order to achieve the above purpose, in a first aspect, one embodiment of the present disclosure discloses a flexible antenna structure, including:

a flexible printed circuit board;

a mm-Wave antenna disposed on the flexible printed circuit board and conformal with the flexible printed circuit board;

a non-mm-Wave antenna disposed on the flexible printed circuit board and conformal with the flexible printed circuit board.

Compared with the existing art, by means of the flexible antenna structure provided with the mm-Wave antenna and the non-mm-Wave antenna on the flexible printed circuit board, the present disclosure realizes integration of the mm-Wave antenna and the non-mm-Wave antenna, solves a challenge of numerous antennas in the electronic device, and realizes conformation with a bent part of a shell, thus increasing the space utilization rate in a limited space. Furthermore, the overall size and cost cannot be increased, thus improving the competitiveness of a product.

In one embodiment, the flexible printed circuit board includes a first surface and a second surface located on a side opposite to the first surface, and the mm-Wave antenna and at least part of the non-mm-Wave antenna are located on the first surface. By means of disposing the mm-Wave antenna and the non-mm-Wave antenna on the same surface, a compact design of the flexible antenna structure can be realized, and the requirement of the flexible antenna structure for the overall size of the electronic device is lowered, thus reducing the cost and improving the competitiveness of the product. In addition, when the mm-Wave antenna and the non-mm-Wave antenna are located on the first surface and are close to an outer side of the electronic device, the flexible antenna structure further has a technical effect of good radiation effect.

In one embodiment, the non-mm-Wave antenna is located on at least one side of the mm-Wave antenna and is independent of the mm-Wave antenna by a distance. By means of independently spaced arrangement of the non-mm-Wave antenna and the mm-Wave antenna, mutual interference between the two antennas can be reduced, and the radiation effect of the flexible antenna structure is enhanced.

In one embodiment, the flexible antenna structure further includes a first conductive layer having at least one opening region; the mm-Wave antenna is arranged in the opening region and is away from the first conductive layer by a distance; the non-mm-Wave antenna is located on at least one side of the first conductive layer and is away from the first conductive layer by a distance; and the first conductive layer is grounded. By means of the arrangement of the first conductive layer that is grounded, a reference ground potential of a radio frequency can be provided for the flexible antenna structure, which is favorable for designing the flexible antenna structure, guaranteeing the basic performance of the flexible antenna structure, and enhancing the radiation effect of the product. Meanwhile, the first conductive layer can achieve a more effective effect of reducing crosstalk between mm-Wave antenna signals, so that the flexible antenna structure has good radiation effect, and a more compact mm-Wave antenna structure can be achieved. The flexible antenna structure is more compact.

In one embodiment, the non-mm-Wave antenna has at least one opening region, and the mm-Wave antenna is arranged in the opening region and is away from the non-mm-Wave antenna by a distance. By the arrangement of the distance, mutual interference between the mm-Wave antenna and the non-mm-Wave antenna can be reduced, and the radiation effect of the flexible antenna structure is enhanced.

In one embodiment, the non-mm-Wave antenna includes a first non-mm-Wave antenna unit and a second non-mm- Wave antenna unit; the first non-mm-Wave antenna unit and the second non-mm-Wave antenna unit are independent of each other by a distance; and the first non-mm-Wave antenna unit and the second non-mm-Wave antenna unit are further used to be electrically connected to one non-mm-Wave antenna feed source assembly, respectively. It can be understood that by means of the arrangement of the two non-mm-Wave antenna units, a usage requirement of two or more non-mm-Wave antennas of the existing electronic device can be met.

In one embodiment, the flexible printed circuit board includes a first surface and a second surface located on a side opposite to the first surface, and at least part of the mm-Wave antenna and at least part of the non-mm-Wave antenna are located on the first surface and the second surface, respectively. By the above arrangement, at least part of the mm-Wave antenna and at least part of the non-mm-Wave antenna are distributed on different planes, and spaces on front and back surfaces of the flexible printed circuit board can be fully used, so that the flexible antenna structure has a relatively small planar size, and the comprehensive competitiveness of the entire product can be improved.

In one embodiment, along a direction from the first surface to the second surface, the mm-Wave antenna at least partially overlaps the position of at least part of the non-mm-Wave antenna. By means of the above arrangement, the flexible antenna structure can be designed to be more compact to increase the space utilization rate, thus improving the comprehensive competitiveness of the product.

In one embodiment, at least part of the non-mm-Wave antenna located on the second surface is used to be electrically connected to at least two non-mm-Wave antenna feed source assemblies and grounded. It can be understood that by means of the above-mentioned arrangement, one non-mm-Wave antenna can be electrically connected to one non-mm-Wave antenna feed source assembly and grounded to form a radiation effect of two non-mm-Wave antennas, so that the space utilization rate can be increased, and the product performance can also be improved.

In one embodiment, the non-mm-Wave antenna includes a first non-mm-Wave antenna unit and a second non-mm-Wave antenna unit; the first non-mm-Wave antenna unit and the mm-Wave antenna are disposed on the first surface and are independent of each other by a distance; and the second non-mm-Wave antenna unit is disposed on the second surface. By the spaced arrangement, the mutual interference between the mm-Wave antenna and the first non-mm-Wave antenna unit can be reduced, and the radiation effect of the flexible antenna structure can be enhanced. By disposing the second non-mm-Wave antenna unit on the second surface, the space utilization rate can be increased, and the radiation effect of the non-mm-Wave antenna can also be enhanced.

In one embodiment, the first non-mm-Wave antenna unit has at least one opening region, and the mm-Wave antenna is located in the opening region. By the above arrangement, the flexible antenna structure can be designed to be more compact to increase the space utilization rate, which is favorable for reducing the interference between the mm-Wave antenna and the non-mm-Wave antenna and reducing the crosstalk between the mm-Wave antenna signals, thus improving the comprehensive competitiveness of the product.

In one embodiment, the flexible antenna structure further includes a first conductive layer that is disposed on the first surface and includes at least one opening region. The mm-Wave antenna is arranged in the opening region. By the arrangement of the first conductive layer, the crosstalk between different mm-Wave antenna signals of the mm-Wave antenna can be better prevented. Since the mm-Wave antenna is arranged in the opening region, the flexible antenna structure can be designed to be more compact to increase the space utilization rate, thus improving the radiation effect of the product.

In one embodiment, the number of the at least one opening region is multiple; the mm-Wave antenna includes a plurality of mm-Wave antenna units; and the plurality of mm-Wave antenna units are respectively arranged in the plurality of opening regions. By the arrangement of the plurality of mm-Wave antenna units, the communication capability of the mm-Wave antenna can be improved to meet the usage requirement of the existing electronic device for the plurality of mm-Wave antennas. The plurality of mm-Wave antenna units are respectively arranged in the plurality of opening regions, so that the first conductive layer can effectively improve the signal crosstalk between the plurality of mm-Wave antennas and enhance the radiation effect.

In one embodiment, the non-mm-Wave antenna includes a first part and a second part. The first part and the mm-Wave antenna are disposed on the first surface and are independent of each other at an interval. The second part is disposed on the second surface. The first part and the second part are electrically connected through a via hole running through the flexible printed circuit board. The first part and the second part are respectively disposed on the first surface and the second surface and are electrically connected through the via hole running through the flexible printed circuit board, so that the area of the non-mm-Wave antenna can be enlarged. The radiation effect is enhanced while the space of the flexible printed circuit board is fully used, thus improving the comprehensive competitiveness of the product, In one embodiment, the non-mm-Wave antenna includes a first non-mm-Wave antenna unit and a second non-mm-Wave antenna unit; the mm-Wave antenna is disposed on the first surface; and the first non-mm-Wave antenna unit and the second non-mm-Wave antenna unit are independent of each other and are disposed on the second surface at an interval. By the foregoing arrangement, the mutual interference between the mm-Wave antenna and the non-mm-Wave antenna can be reduced, the radiation effect is enhanced, and the space utilization rate is also increased, thus improving the comprehensive competitiveness of the product. In addition, by means of the arrangement of the two non-mm-Wave antenna units, a usage requirement of two or more non-mm-Wave antennas of the existing electronic device can be met.

In one embodiment, the flexible antenna structure further includes a second conductive layer which is disposed on the second surface and used for being grounded. By means of the arrangement of the second conductive layer that is grounded, a reference ground potential of a radio frequency can be provided for the flexible antenna structure, which is favorable for designing the flexible antenna structure, guaranteeing the basic performance of the flexible antenna structure, and enhancing the radiation effect of the product.

In one embodiment, the flexible printed circuit board has a second via hole running through the flexible printed circuit board; a conductor is arranged in the second via hole; the non-mm-Wave antenna covers a side of the via hole and is also used to be electrically connected to a feed source of the non-mm-Wave antenna via the conductor on the other side of the second via hole. By the foregoing arrangement, the antenna efficiency can be improved, and the space utilization rate is increased, thus improving the comprehensive competitiveness of the product.

In one embodiment, the flexible printed circuit board includes a first medium layer and a second medium layer which are disposed oppositely, and a conductive line clamped between the first medium layer and the second medium layer; the mm-Wave antenna is disposed on a side of the first medium layer away from the second medium layer; the conductive line is clamped between the first medium layer and the second medium layer; the first medium layer has a third via hole; a conductor is arranged in the third via hole; the mm-Wave antenna is electrically connected with the conductive line through the conductor in the third conductive hole; and the mm-Wave antenna can be electrically connected to an external device via the flexible printed circuit board through the first medium layer, the second medium layer, and the third via hole. Since the flexible printed circuit board is bendable and has relatively high flexibility, it is convenient for electrical connection and assembling of the flexible antenna structure, the design flexibility is improved, the design and assembling cost is reduced, and the assembling efficiency is improved.

In one embodiment, the flexible printed circuit board includes a main body part and an extension part connected with one side of the main body part; a width of the extension part in a preset direction is less than that of the main body part in the preset direction; the mm-Wave antenna is disposed on the main body part and is used to be electrically connected to a mm-Wave radio-frequency integrated circuit via the extension part; and the non-mm-Wave antenna is located on the main body part. Since the flexible printed circuit board is bendable and has relatively high flexibility, the narrower extension part is electrically connected to the mm-Wave radio-frequency integrated circuit, which is favorable for the electrical connection and assembling of the flexible antenna structure, the design flexibility is improved, the design and assembling cost is reduced, and the assembling efficiency is improved.

In one embodiment, the main body part includes a middle region, a first region connected to one side of the middle region, and a second region connected to the other side of the middle region; and the extension part is connected to the middle region. By means of the arrangement of the extension part connected to the middle region, an internal route can respectively extend from the first region and the second region to the middle region and then extend to the extension part, which is conductive to reducing the wiring length and area, thereby facilitating reducing the size of the entire flexible antenna structure and improving the product competitiveness.

In one embodiment, the main body part has a rectangular planar shape, and the extension part has a rectangular planar shape; and the main body part and the extension part are perpendicularly connected into a T shape. The flexible antenna structure of the T-shaped structure is very convenient for the extension part to bend with respect to the main body part, so that electrical connection between the extension part and an external device is facilitated, and the assembling efficiency is improved.

In one embodiment, a joint of at least one of the first region and the second region and the middle region has an opening part. The arrangement of the opening part is very convenient for the extension part to bend with respect to the main body part. Furthermore, after the bending, the bottom of the extension part and the bottom of the main body part may be approximately on the same plane, which is favorable for improving the assembling flatness of the flexible antenna structure.

In one embodiment, the extension part includes a first extension part and a second extension part; the first extension part is connected with one end of the main body part; the second extension part is connected with the first extension part and is used to be electrically connected to the mm-Wave radio-frequency integrated circuit; a first edge of the main body part located on a first side of the flexible printed circuit board and a second edge of the first extension part located on the first side are collinear; a width of the first extension part in a direction perpendicular to the second edge is less than a width of the main body part along the first edge; and the second extension part and the first extension part are connected in a bent manner. By means of the foregoing design, the main body part and the first extension part can be disposed on the inner side of a shell of the electronic device to achieve a good radiation effect. The first edge and the second edge can be disposed in a manner of corresponding to a surface of a main circuit board in the shell; and the second extension part can bend to be superposed with the surface of the main circuit board relative to the first extension part, so as to be electrically connected to the main circuit board and then electrically connected to the mm-Wave radio-frequency integrated circuit located on the main circuit board. The above-mentioned structure is convenient for the arrangement of the flexible antenna structure, so that the flexible antenna structure can guarantee the radiation effect, is also convenient to assemble, and has relatively high space utilization rate. It is favorable for reducing the size of the flexible antenna structure, thus reducing the overall size and cost and improving the comprehensive competitiveness of the product.

In a second aspect, the present disclosure further discloses an electronic device. The electronic device includes a shell, a main circuit board located in the shell, and the flexible antenna structure according to any one of the embodiments. The main circuit board is provided with a non-mm-Wave antenna feed source assembly and a mm-Wave radio-frequency integrated circuit; the shell includes a bent part; the flexible antenna structure is disposed on the bent part and is conformal with the bent part; the flexible antenna structure is also electrically connected with the main circuit board, so that the mm-Wave antenna is electrically connected with the mm-Wave radio-frequency integrated circuit; and the non-mm-Wave antenna is electrically connected with the non-mm-Wave antenna feed source assembly.

In the electronic device, by means of the flexible antenna structure provided with the mm-Wave antenna and the non-mm-Wave antenna on the flexible printed circuit board, integration of the c is realized, a challenge of numerous antennas in the electronic device is solved, and conformation with the bent part of the shell is realized, so that the space utilization rate is increased in a limited space. Furthermore, the overall size and cost cannot be increased, thus improving the competitiveness of a product. In addition, the electronic device uses the flexible antenna structure in the foregoing embodiment, so that it also has other further features and advantages of the flexible antenna structure, and descriptions thereof are omitted here.

BRIEF DESCRIPTION OF THE DRAWINGS

In order to explain the technical solutions of the embodiments of the present disclosure more clearly, the following will briefly introduce the accompanying drawings used in the embodiments. Apparently, the drawings in the following description are only some embodiments of the present disclosure. Those of ordinary skill in the art can obtain other drawings based on these drawings without creative work.

DETAILED DESCRIPTION OF THE EMBODIMENTS

Figure 1:
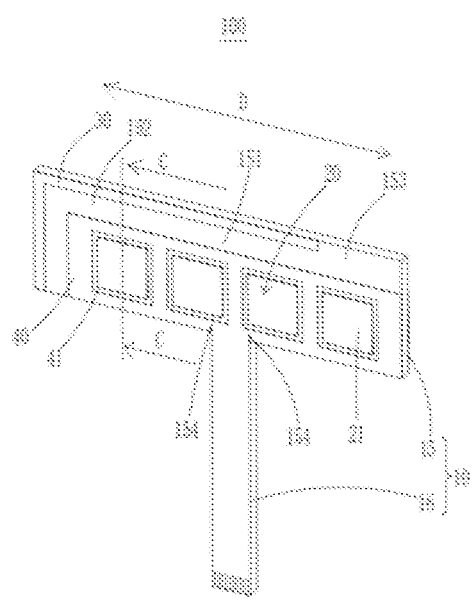
FIG. 1 is a schematic view of a flexible antenna structure disclosed in Embodiment I of the present disclosure.

The technical solutions in the embodiments of the present invention will be clearly and completely described below in conjunction with the accompanying drawings in the embodiments of the present invention. Apparently, the described embodiments are only a part of the embodiments of the present invention, rather than all the embodiments. Based on the embodiments in the present disclosure, all other embodiments obtained by those of ordinary skill in the art without creative work shall fall within the protection scope of the present disclosure.

In the present disclosure, orientations or positional relationships indicated by the terms "upper", "lower", "left", "right", "front", "rear", "top", "bottom", "inner", "outer", "middle", "vertical", "horizontal", "transverse", "longitudinal", etc. are based on orientations or positional relationships shown in the drawings. These terms are mainly used to better describe the present disclosure and embodiments of the present disclosure, and are not used to limit that the indicated device, element, or component must have a specific orientation, or be constructed and operated in a specific orientation.

In addition, some of the above terms may be used to indicate other meanings in addition to the orientations or position relationships. For example, the term "upper" may also be used to indicate a certain dependence relationship or connection relationship in some cases. For those of ordinary skill in the art, the specific meanings of the above terms in the present disclosure can be understood according to specific situations.

In addition, the terms "install", "arrange", "provide", "connect" and "couple" should be understood broadly. For example, it can be a fixed connection, a detachable connection, an integral structure, a mechanical connection, an electrical connection, a direct connection, an indirect connection through an intermediate medium, or a communication between two devices, elements or components. For those of ordinary skill in the art, the specific meanings of the above terms in the present invention can be understood according to specific situations.

In addition, the terms "first", "second", etc., are used primarily to distinguish different devices, elements or components (the specific type and construction may be the same or different) and are not used to indicate or imply the relative importance or quantity of the indicated device, element or component. Unless otherwise stated, "plurality" means two or more.

Embodiment I

Figure 2:
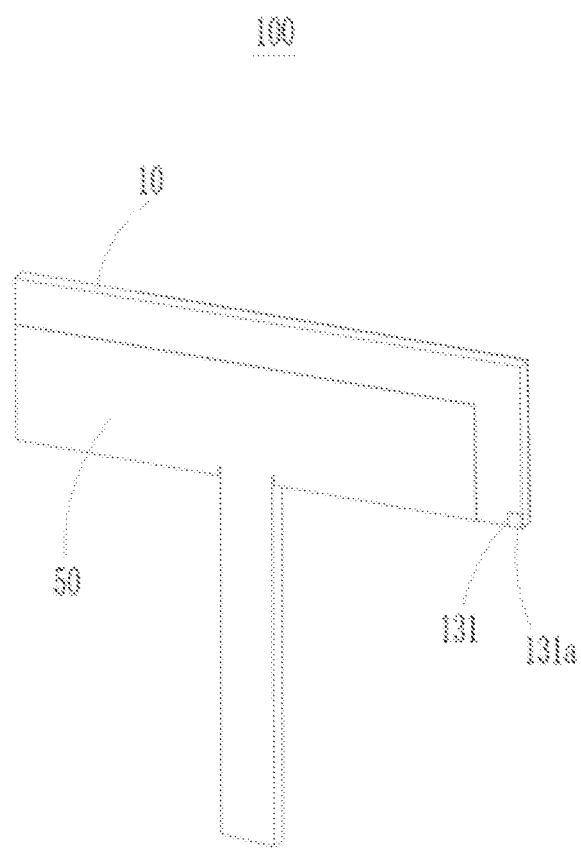
FIG. 2 is a schematic view from another angle of the flexible antenna structure shown in FIG. 1.
Figure 3:
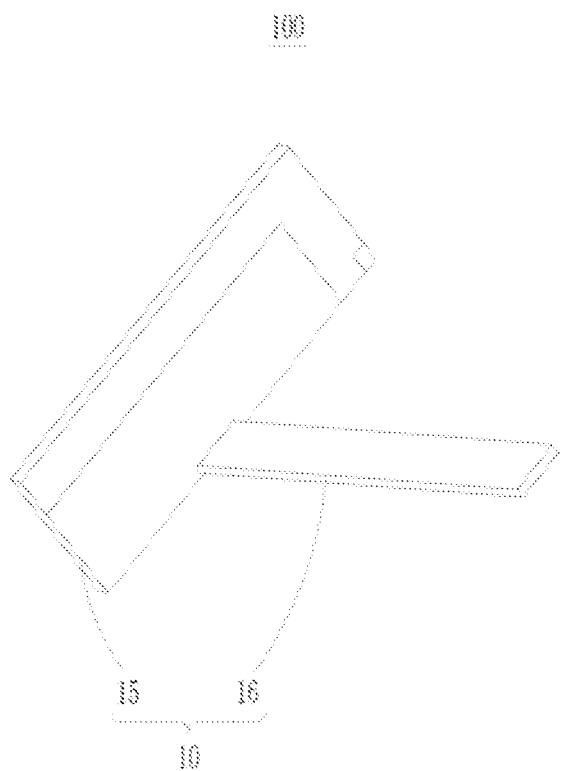
FIG. 3 is a schematic view illustrating that the flexible antenna structure of FIG. 1 is in a used state.
Figure 4:
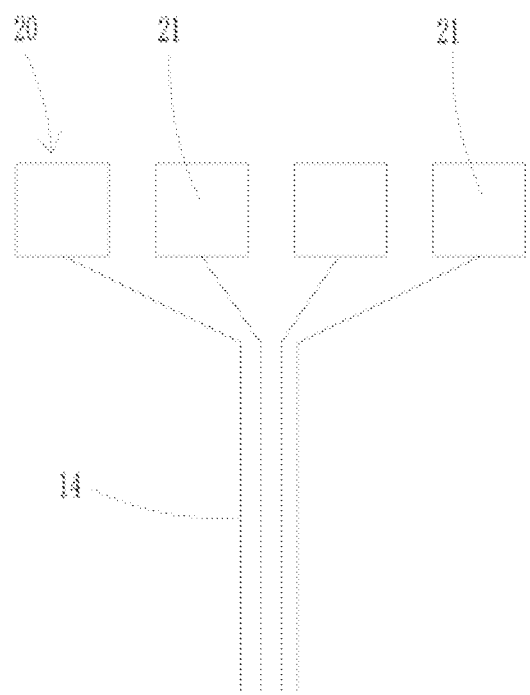
FIG. 4 is a schematic view of electrical connection between a mm-Wave antenna and a conductive line of the flexible antenna structure shown in FIG. 1.
Figure 5:
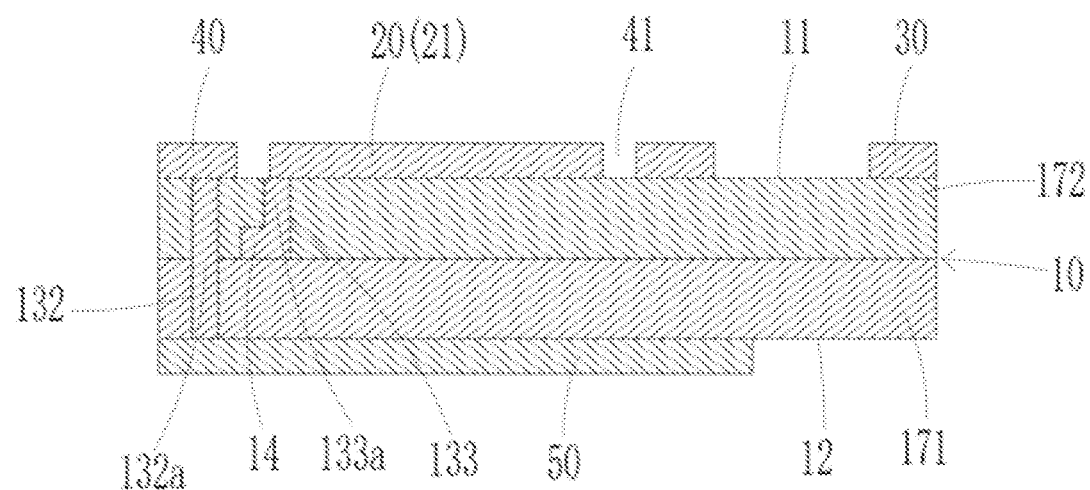
FIG. 5 is a cross-section view of the flexible antenna structure shown in FIG. 1 along line C-C.

Referring to FIG. 1, FIG. 2, FIG. 3, FIG. 4, and FIG. 5, FIG. 1 is a schematic view of a flexible antenna structure 100 disclosed in Embodiment I of the present disclosure; FIG. 2 is a schematic view from another angle of the flexible antenna structure 100 shown in FIG. 1; FIG. 3 is a schematic view illustrating that the flexible antenna structure 100 shown in FIG. 1 is in a used state; FIG. 4 is a schematic view of electrical connection between a mm-Wave antenna 20 and a conductive line 14 of the flexible antenna structure 100 shown in FIG. 1; and FIG. 5 is a cross-section view of the flexible antenna structure 100 shown in FIG. 1. The flexible antenna structure 100 includes a flexible printed circuit board 10, a mm-Wave antenna 20 disposed on the flexible printed circuit board 10 and conformal with the flexible printed circuit board 10, and a non-mm-Wave antenna 30 disposed on the flexible printed circuit board 10 and conformal with the flexible printed circuit board 10. It can be understood that the conformation refers to that the mm-Wave antenna 20 and the non-mm-Wave antenna 30 deform and bend together with the deformation and bending of the flexible printed circuit board 10.

Compared with the existing art, by means of the flexible antenna structure provided with the mm-Wave antenna 20 and the non-mm-Wave antenna 30 on the flexible printed circuit board 10, the present disclosure realizes integration of the mm-Wave antenna 20 and the non-mm-Wave antenna 30, solves a challenge of numerous antennas in the electronic device at the 5G era, and realizes conformation with an arc-shaped shell, thereby increasing the space utilization rate in a limited space. Furthermore, the overall size and cost cannot be increased, thus improving the competitiveness of a product.

Specifically, the flexible printed circuit board 10 includes a first surface 11 and a second surface 12 located on a side opposite to the first surface 11, and the mm-Wave antenna 20 and the non-mm-Wave antenna 30 are located on the first surface 11. By means of disposing the mm-Wave antenna 20 and the non-mm-Wave antenna 30 on the same surface, a compact design of the flexible antenna structure 100 can be realized, and the requirement of the flexible antenna structure 100 for the overall size of the electronic device is lowered, thus reducing the cost and improving the competitiveness of the product. In addition, when the mm-Wave antenna 20 and the non-mm-Wave antenna 30 are located on the first surface and are close to an outer side of the electronic device, the flexible antenna structure further has a technical effect of good radiation effect.

Further, the non-mm-Wave antenna 30 is located on at least one side of the mm-Wave antenna 20 and is independent of the mm-Wave antenna 20 by a distance. In the present embodiment, the non-mm-Wave antenna 30 is located on one side of the mm-Wave antenna 20 and is independent of the mm-Wave antenna 20 by a distance. By means of independently spaced arrangement of the non-mm-Wave antenna 30 and the mm-Wave antenna 20, mutual interference between the two antennas can be reduced, and the radiation effect of the flexible antenna structure 100 is enhanced. Further, in the present embodiment, the non-mm-Wave antenna 30 can be disposed along an edge of the flexible printed circuit board 10. Specifically, it can be disposed along two adjacent sides of the flexible printed circuit board 10 to achieve small size and good radiation effect. In the present embodiment, the non-mm-Wave antenna 30 is L-shaped, and includes two strip-type parts which are perpendicular to each other.

The flexible antenna structure 100 further includes a first conductive layer 40. The first conductive layer is disposed on the first surface 11 and has at least one opening region 41; the mm-Wave antenna 20 is arranged in the opening region 41 and is away from the first conductive layer 40 by a distance; the non-mm-Wave antenna 30 is located on at least one side of the first conductive layer 40 and is away from the first conductive layer 40 by a distance; and the first conductive layer 40 may be grounded. Specifically, the first conductive layer 40, the mm-Wave antenna 20 and the non-mm-Wave antenna 30 are formed in steps of the same process. Since the first conductive layer 40 is grounded, crosstalk between different mm-Wave antenna signals can be better prevented, thus enhancing the radiation effect of the product.

Specifically, the number of the at least one opening region 41 is multiple; the mm-Wave antenna 20 may include a plurality of mm-Wave antenna units 21 (such as two or more mm-Wave antenna units 21); and the plurality of mm-Wave antenna units 21 are respectively arranged in the plurality of opening regions 41. In detail, the plurality of mm-Wave antenna units 21 are electrically connected with the flexible printed circuit board 10 and form a mm-Wave antenna array. Each mm-Wave antenna array is at least one of a linear array, a square array, a rectangular array, a triangular array, a circular array, and a non-isometric. In the present embodiment, a linear mm-Wave antenna array arranged in a predetermined direction is taken as an example to make schematic descriptions. By the arrangement of the plurality of mm-Wave antenna units 21, the radiation effect of the mm-Wave antenna 20 can be enhanced. By means of the first conductive layer 40, signal crosstalk between different mm-Wave antenna units 21 can be better prevented, thus enhancing the radiation effect of the product.

Further, the flexible printed circuit board 10 has a via hole 131 running through the flexible printed circuit board 10; a conductor 131a is arranged in the via hole 131; the non-mm-Wave antenna 30 covers a side of the via hole 131 and is also used to be electrically connected to a non-mm-Wave antenna feed source assembly via the other side of the via hole 131. Specifically, by the foregoing arrangement, the antenna efficiency can be improved, and the space utilization rate is increased, thus improving the comprehensive competitiveness of the product.

The flexible printed circuit board 10 includes a first medium layer 171 and a second medium layer 172 which are disposed oppositely, and a conductive line 14 clamped between the first medium layer 171 and the second medium layer 172; the mm-Wave antenna 20 is disposed on a side of the first medium layer 171 away from the second medium layer 172; the conductive line 14 is clamped between the first medium layer 171 and the second medium layer 172; the first medium layer 171 has a via hole 133; a conductor 133a is arranged in the via hole 133; the mm-Wave antenna 20 is electrically connected with the conductive line 14 through the conductor 133a in the conductive hole 133; and the mm-Wave antenna 20 can be electrically connected to an external device (such as an external printed circuit board) via the flexible printed circuit board 10 through the first medium layer 171, the second medium layer 172, and the via hole 133. Since the flexible printed circuit board 10 is bendable and has relatively high flexibility, it is convenient for electrical connection and assembling of the flexible antenna structure 100, the design flexibility is improved, the design and assembling cost is reduced, and the assembling efficiency is improved. In the present embodiment, the design that the mm-Wave antenna unit 21 is electrically connected with one conductive line 14 so as to be electrically connected to an external device through the corresponding conductive line 14 is mainly taken as an example for schematic illustration. In other embodiments, each of two ends of the mm-Wave antenna unit 21 may be electrically connected with one conductive line. In addition, in the present embodiment, the design that the flexible printed circuit board 10 has two medium layers is taken as an example for schematic illustration. In other embodiments, the flexible printed circuit board 10 may have three or more medium layers. The conductive line 14 may also be respectively disposed between different medium layers.

The mm-Wave antenna 20 is electrically connected with the flexible printed circuit board 10, so that the mm-Wave antenna 20 may be electrically connected to the mm-Wave radio-frequency integrated circuit (RFIC) 22 via the flexible printed circuit board 10. The flexible printed circuit board 10 includes a main body part 15 and an extension part 16 connected to one side of the main body part 15. A width of the extension part 16 in a preset direction D is less than that of the main body part 15 in the preset direction D. The mm-Wave antenna 20 is disposed on the main body part 15 and is used to be electrically connected to the mm-Wave RFIC 22 via the extension part 16. The non-mm-Wave antenna 30 is located on the main body part 15. Since the flexible printed circuit board 10 is bendable and has relatively high flexibility, the narrower extension part 16 is electrically connected to the mm-Wave RFIC 22, which is favorable for the electrical connection and assembling of the flexible antenna structure 100, the design flexibility is improved, the design and assembling cost is reduced, and the assembling efficiency is improved.

The main body part 15 may include a middle region 151, a first region 152 connected to one side of the middle region 151, and a second region 153 connected to the other side of the middle region 151; and the extension part 16 is connected to the middle region 151. By means of the arrangement of the extension part 16 connected to the middle region 151, an internal route can respectively extend from the first region 152 and the second region 153 to the middle region 151 and then extend to the extension part 16, which is conductive to reducing the wiring length and area, thereby facilitating reducing the size of the entire flexible antenna structure and improving the product competitiveness.

The main body part 15 has a rectangular planar shape, and the extension part 16 has a rectangular planar shape; and the main body part 15 and the extension part 16 are perpendicularly connected into a T shape. The flexible antenna structure 100 of the T-shaped structure is very convenient for the extension part 16 to bend with respect to the main body part 15, so that electrical connection between the extension part 16 and an external device is facilitated, and the assembling efficiency is improved.

As shown in FIG. 3, when the flexible antenna structure 100 is in a used state, the extension part 16 may bend with respect to the main body part 15, and the extension part 16 may have a connection terminal that is welded and fixed with and electrically connected to a connection terminal of an external device (such as a circuit board). However, it can be understood that in other embodiments, an end of the extension part 16 away from the main body part 15 may be provided with a first connector having a connection terminal and used to be connected to a second connector having a connection terminal on the external device (such as the circuit board), so that the electrical connection between the extension part 16 and the external device is not limited to the above-mentioned welding manner.

In one embodiment, a joint of at least one of the first region 152 and the second region 153 and the middle region 151 has an opening part 154. By the arrangement of the opening part 154, it is convenient for the extension part 16 to bend with respect to the main body part 15. After the bending, the bottom of the extension part 16 and the bottom of the main body part 15 may be flush and approximately on the same plane, thereby facilitating improving the assembling flatness of the flexible antenna structure 100. In the present embodiment, joints of the first region 152 as well as the second region 153 and the middle region 151 have the opening parts 154 which may be symmetric.

Specifically, in one embodiment, the mm-Wave antenna 20 can be directly electrically connected to the mm-Wave RFIC 22. It can be understood that in another embodiment, the mm-Wave antenna 20 can be electrically connected to the mm-Wave RFIC 22 via a filter element, that is, an antenna signal of the mm-Wave antenna 20 is provided for the mm-Wave RFIC 22 after being filtered by the filter element. By means of the filter element, a radio-frequency signal of the non-mm-Wave antenna feed source assembly can be isolated, so that the mm-Wave RFIC 22 works stably, with high performance, and is favorable for the design and performance of the non-mm-Wave antenna.

The flexible antenna structure 100 further includes a second conductive layer 50 which is disposed on the second surface 12 and used for being grounded. By means of the arrangement of the second conductive layer 50 that is grounded, a reference ground potential of a radio frequency can be provided for the flexible antenna structure 100, which is favorable for designing the flexible antenna structure 100, guaranteeing the basic performance of the flexible antenna structure 100, and enhancing the radiation effect of the product. In the present embodiment, the flexible printed circuit board 10 can have a run-through via hole 132. The via hole 132 has a conductor 132*a* inside. The second conductive layer 50 can be electrically connected to the first conductive layer 40 through the conductor 132*a* in the via hole 132. The first conductive layer 40 and the second conductive layer 50 are disposed on both surfaces of the flexible printed circuit board 10 which are back to back and grounded, so that the reference ground potential of the radio frequency is provided for the flexible antenna structure 100, and an effect of effectively reducing the signal crosstalk between different mm-Wave antenna units 21 (i.e., the isolation effect between the mm-Wave antenna units 21 can be effectively enhanced), so that the flexible antenna structure 100 has good radiation effect. A more compact mm-Wave antenna structure can be obtained, so that the flexible antenna structure 100 is more compact.

Figure 6:
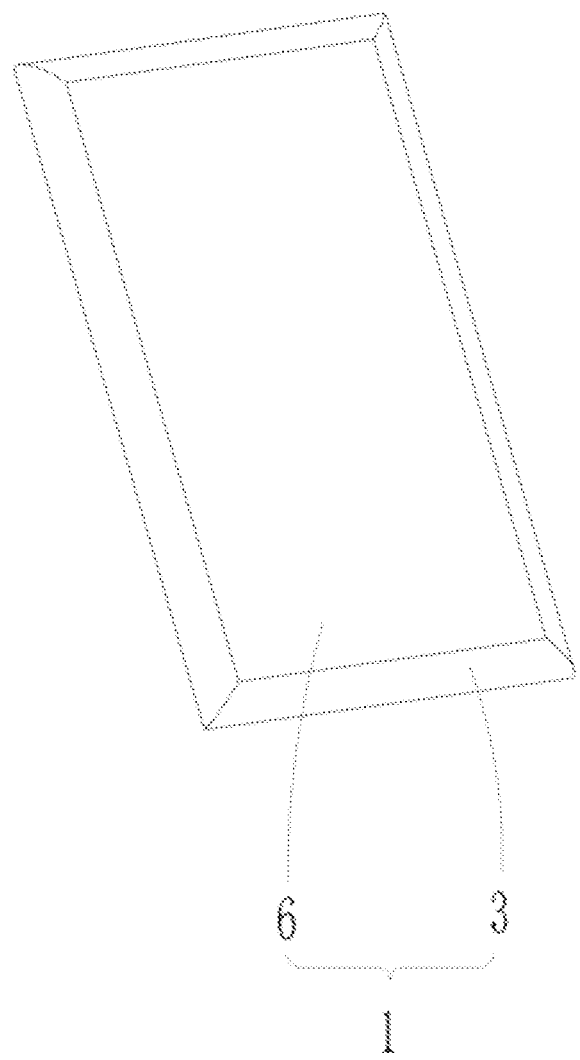
FIG. 6 is a schematic view of an electronic device having the flexible antenna structure shown in FIG. 1.
Figure 7:
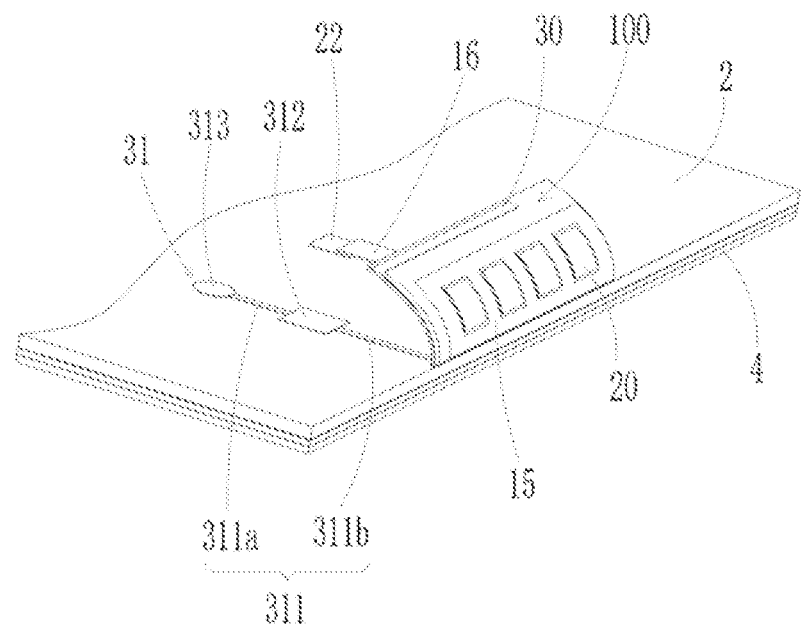
FIG. 7 is a schematic view from another angle after a shell is removed from the electronic device shown in FIG. 6.
Figure 8:
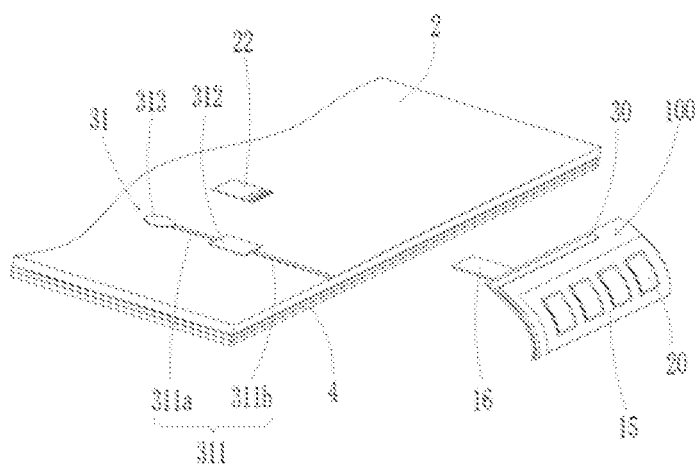
FIG. 8 is an exploded view after a shell is removed from the electronic device shown in FIG. 6.
Figure 9:
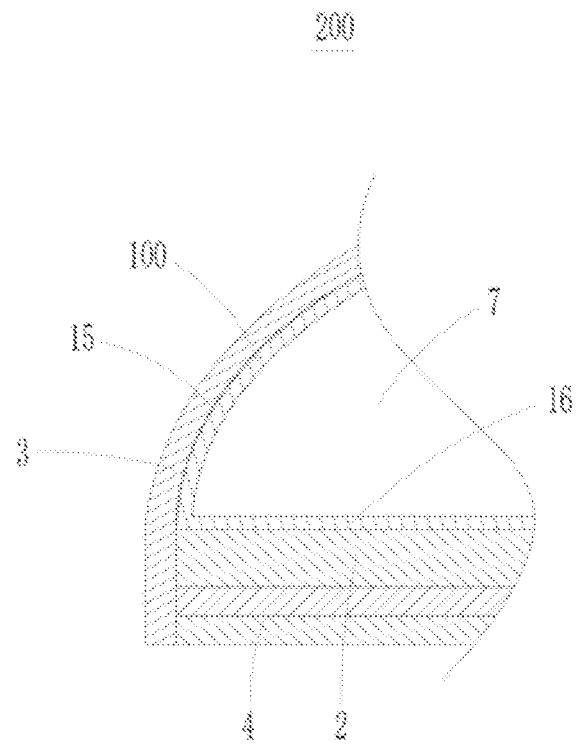
FIG. 9 is a cross-section view of the electronic device shown in FIG. 6.

Referring to FIG. 6, FIG. 7, FIG. 8, and FIG. 9, FIG. 6 is a schematic view of an electronic device 200 having the flexible antenna structure 100 shown in FIG. 1; FIG. 7 is a schematic view from another angle after a shell 1 is removed from the electronic device 200 shown in FIG. 6; FIG. 8 is an exploded view after a shell 1 is removed from the electronic device 200 shown in FIG. 6; and FIG. 9 is a cross-section view of the electronic device 200 shown in FIG. 6. It can be understood that the present embodiment is schematically illustrated mainly by taking a mobile phone serving as the electronic device 200 as an example. FIG. 6 is a schematic diagram of the back surface of the electronic device 200. Specifically, the electronic device 200 includes a shell 1, a main circuit board 2 located in the shell 1, and the flexible antenna structure 100 of the above Embodiment I. The shell 1 includes a bent part 3. The section of the bent part 3 can be an arc protruding towards the outer side. The main body part 15 of the flexible antenna structure 100 is disposed on the bent part 3 and is conformal with the bent part 3. Specifically, the flexible antenna structure 100 is located in the shell 1, and the main body part 15 is disposed on the inner side of the bent part 3. For example, it is attached to an inner surface of the bent part 3. The mm-Wave antenna 20 and the non-mm-Wave antenna 30 of the flexible antenna structure 100 can be close to the bent part 3, so that the mm-Wave antenna 20 and the non-mm-Wave antenna 30 are closer to the outer side of the electronic device 200 to achieve good radiation effect.

The electronic device 200 further includes a display screen 4. The shell 1 is a rear shell, and includes the bent part 3 and a rear shell main body 6 connected with the bent part 3. The display screen 4 is connected with one end of the bent part 3 away from the rear shell main body 6 to encircle an accommodating cavity 7 together with the rear shell 5. The main circuit board 2 is located in the accommodating cavity 7.

The flexible antenna structure 100 can also be electrically connected with the main circuit board 2. Specifically, the main circuit board 2 can have a non-mm-Wave antenna feed source assembly 31 and a mm-Wave radio-frequency integrated circuit (RFIC) 22.

The non-mm-Wave antenna 30 of the flexible antenna structure 100 is used to be electrically connected with the non-mm-Wave antenna feed source assembly 31 to realize transmission and receiving of a non-mm-Wave antenna signal. Specifically, the non-mm-Wave antenna 30 of the flexible antenna structure 100 can be electrically connected with the non-mm-Wave antenna feed source assembly 31 via the conductor 131*a* in the via hole 131. It can be understood that the non-mm-Wave antenna feed source assembly 31 can include a feeder line 311, a matching network 312 and a feed source 313. The non-mm-Wave antenna 30 is connected with the matching network 312 and the feed source 313 in sequence via the feeder line 311. The feeder line 311 can include a first feeder line 311*a* and a second feeder line 311*b*; the first feeder line 311*a* is connected with the matching network 312 and the feed source 313; one end of the second feeder line 311*b* is connected with the matching network 312, and the other end of the second feeder line 311*b* is connected with the conductor 131*a*; the non-mm-Wave antenna 30 is connected with the feed source 313 via the second feeder line 311*b*, the matching network 312 and the first feeder line 311*a*.

The mm-Wave antenna 20 of the flexible antenna structure 100 is used to be electrically connected with the mm-Wave RFIC 22 through the feeder line 221 via the conductive line 14 from the extension part 16, so as to realize transmission and receiving of mm-Wave antenna signals. As shown in FIGS. 7, 8, and 9, the extension part 16 bends with respect to the main body part 15 and superposed on the main circuit board 2. An end of the extension part 16 away from the main body part 15 is electrically connected to the mm-Wave RFIC 22 on the main circuit board 2. As mentioned above, the extension part 16 and the mm-Wave RFIC 22 may be realized through welding and fixing of the connection terminals, or may be realized through abutment of a pair of connectors.

In the electronic device 200, by means of the flexible antenna structure 100 provided with the mm-Wave antenna 20 and the non-mm-Wave antenna 30 on the flexible printed circuit board 10, integration of the mm-Wave antenna 20 and the non-mm-Wave antenna 30 is realized, a challenge of numerous antennas in the electronic device 200 is solved, and conformation with the bent part of the shell 1 is realized, so that the space utilization rate is increased in a limited space. Furthermore, the overall size and cost cannot be increased, thus improving the competitiveness of a product. In addition, the electronic device 200 uses the flexible antenna structure 100 in the foregoing embodiment, so that it also has other further features and advantages of the flexible antenna structure 100, and descriptions thereof are omitted here.

Embodiment II

Figure 10:
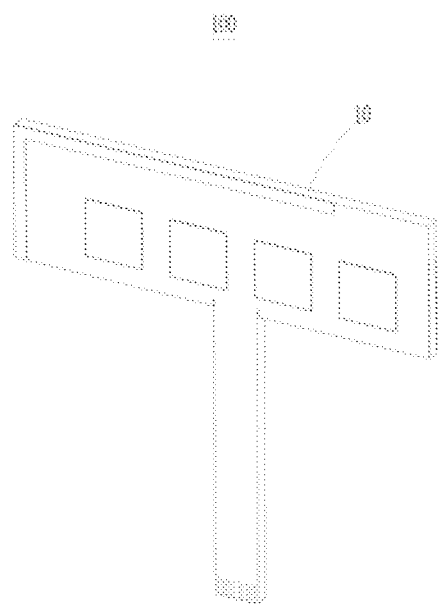
FIG. 10 is a schematic view of a flexible antenna structure disclosed by Embodiment II of the present disclosure.
Figure 11:
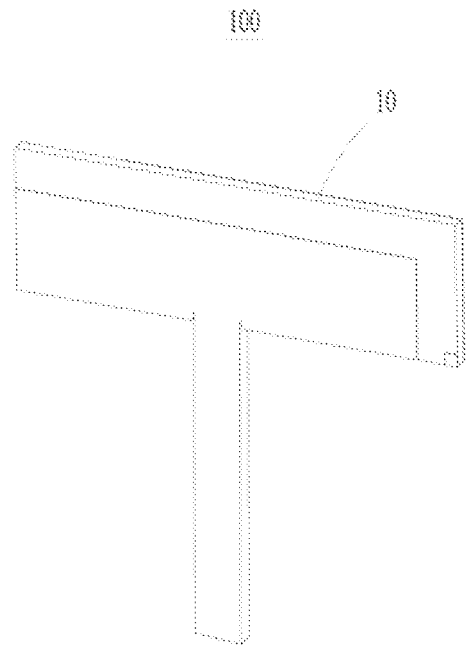
FIG. 11 is a schematic view of the flexible antenna structure disclosed shown in FIG. 10 from another angle.
Figure 12:
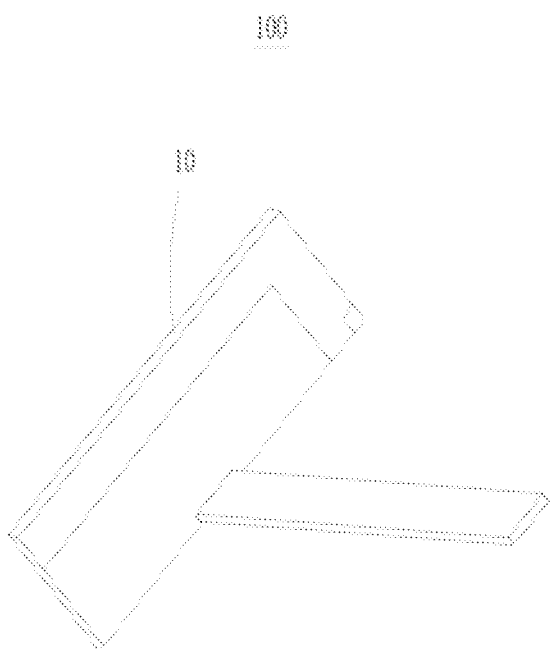
FIG. 12 is a schematic view illustrating that the flexible antenna structure shown in FIG. 10 is in a used state.
Figure 13:
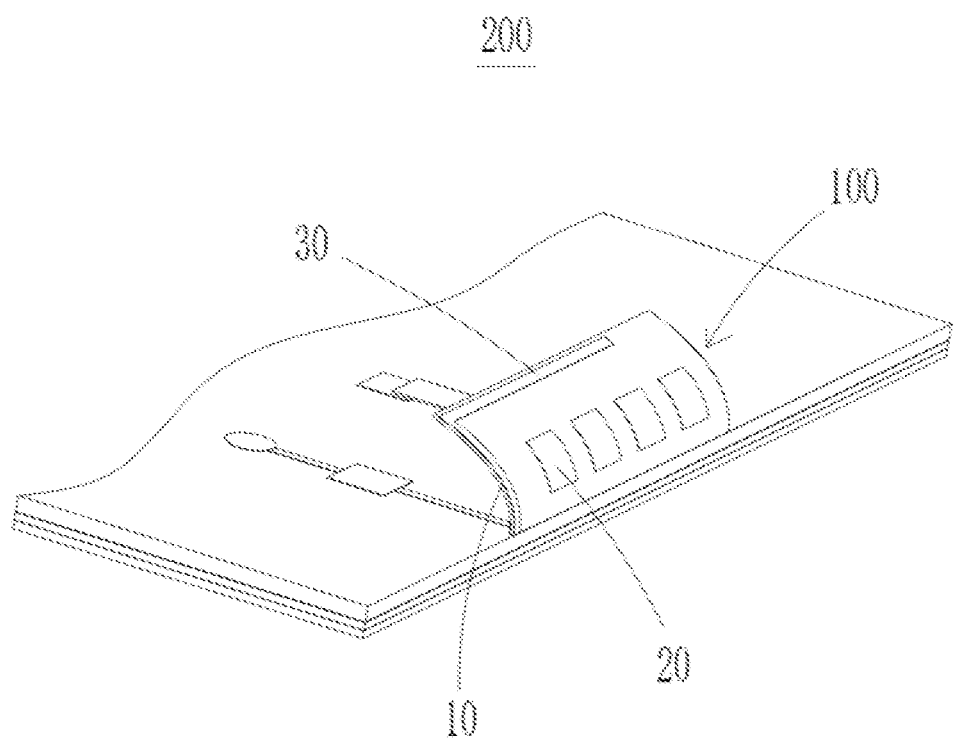
FIG. 13 is a schematic view after a shell is removed from an electronic device having the flexible antenna structure shown in FIG. 10.
Figure 14:
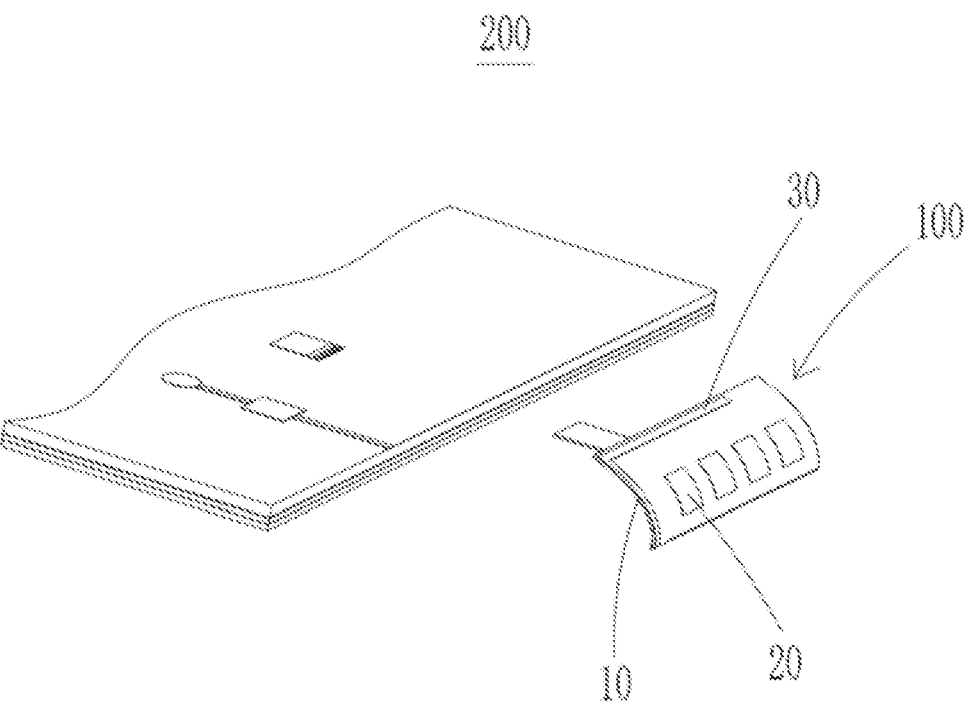
FIG. 14 is an exploded view after a shell is removed from the electronic device shown in FIG. 10.

Referring to FIG. 10, FIG. 11, FIG. 12, FIG. 13, and FIG. 14, FIG. 10 is a schematic view of a flexible antenna structure 100 disclosed in Embodiment II of the present disclosure; FIG. 11 is a schematic view from another angle of the flexible antenna structure 100 shown in FIG. 10; FIG. 12 is a schematic view illustrating that the flexible antenna structure 100 shown in FIG. 10 is in a used state; FIG. 13 is a schematic view after a shell is removed from an electronic device 200 having the flexible antenna structure 100 shown in FIG. 10; and FIG. 14 is a schematic view after a shell is removed from the electronic device 200 shown in FIG. 10. Parts, which are the same as those in the solution of Embodiment I, of the solutions of the flexible antenna structure 100 and the electronic device 200 in the present embodiment are not repeatedly described, and descriptions of differences of the flexible antenna structure 100 and the electronic device 200 in the present embodiment will be emphasized.

In Embodiment II, the flexible antenna structure 100 includes a flexible printed circuit board 10, a mm-Wave antenna 20 disposed on the flexible printed circuit board 10 and conformal with the flexible printed circuit board 10, and a non-mm-Wave antenna 30 disposed on the flexible printed circuit board 10 and conformal with the flexible printed circuit board 10. Compared to Embodiment I, the first conductive layer 40 in Embodiment I can be omitted in the flexible antenna structure 100 and the electronic device 200 of Embodiment II. Compared to Embodiment I, the flexible antenna structure 100 and the electronic device 200 of Embodiment II are simpler in structure, and the size and cost can be further reduced.

Embodiment III

Figure 15:
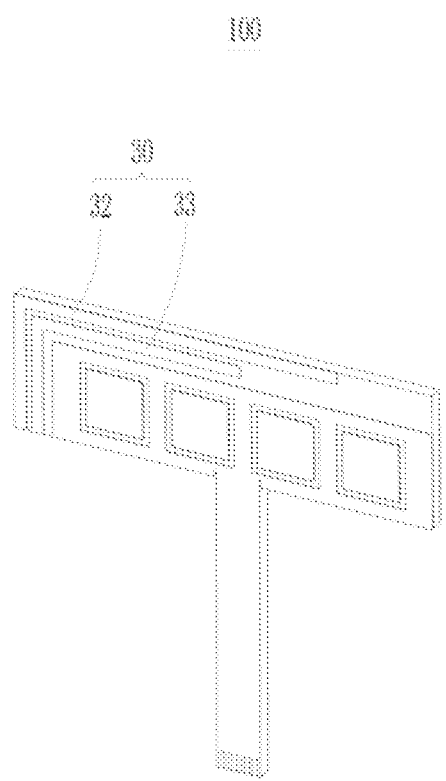
FIG. 15 is a schematic view of a flexible antenna structure disclosed by Embodiment III of the present disclosure.
Figure 16:
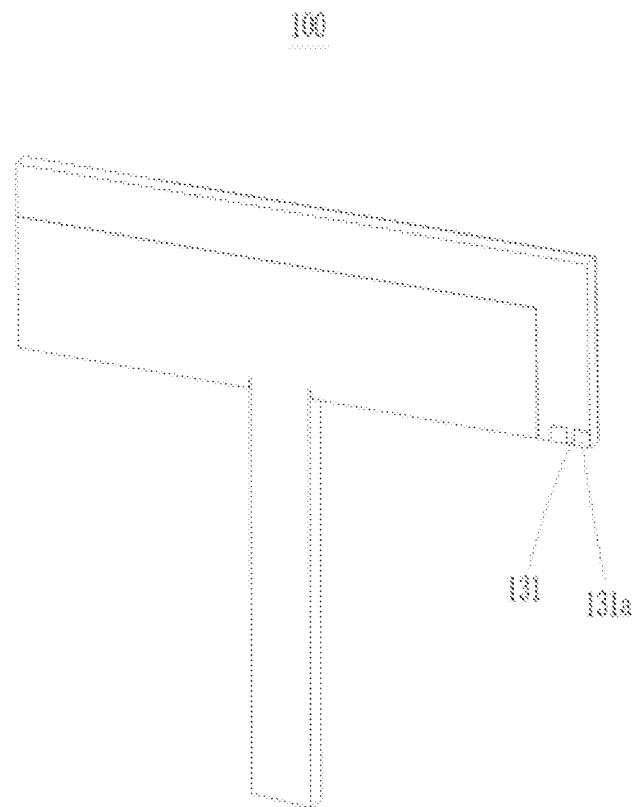
FIG. 16 is a schematic view of the flexible antenna structure shown in FIG. 15 from another angle.
Figure 17:
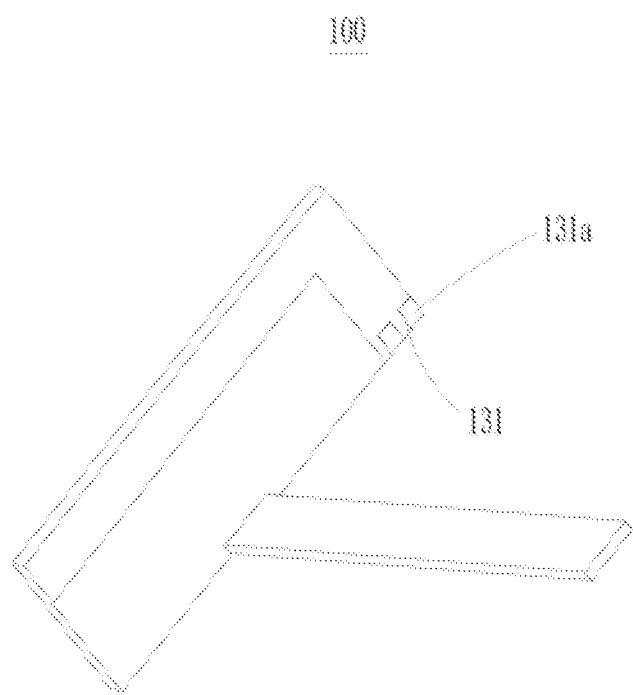
FIG. 17 is a schematic view illustrating that the flexible antenna structure shown in FIG. 15.
Figure 18:
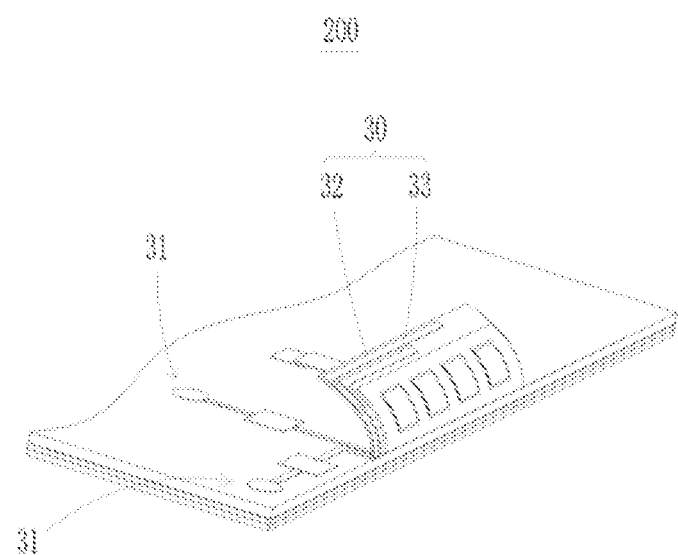
FIG. 18 is a schematic view after a shell is removed from an electronic device having the flexible antenna structure shown in FIG. 15.
Figure 19:
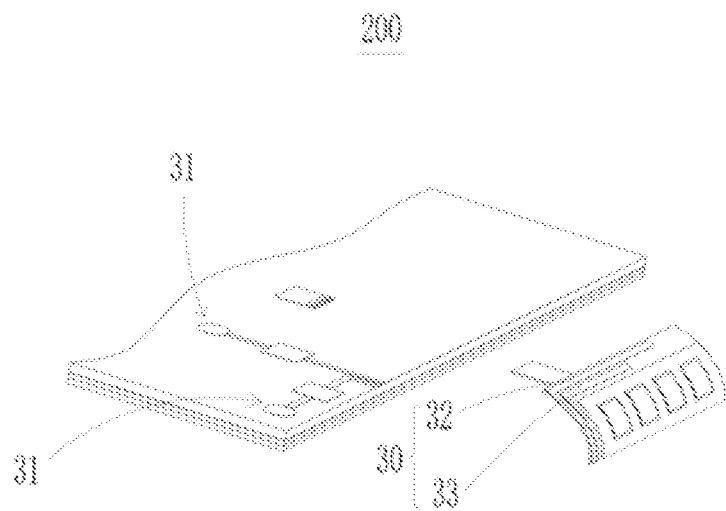
FIG. 19 is an exploded view after a shell is removed from the electronic device shown in FIG. 18.

Referring to FIG. 15, FIG. 16, FIG. 17, FIG. 18, and FIG. 19, FIG. 15 is a schematic view of a flexible antenna structure 100 disclosed in Embodiment III of the present disclosure; FIG. 16 is a schematic view from another angle of the flexible antenna structure 100 shown in FIG. 15; FIG. 17 is a schematic view illustrating that the flexible antenna structure 100 shown in FIG. 15 is in a used state; FIG. 18 is an exploded view after a shell is removed from the electronic device 200 shown in FIG. 18. Parts, which are the same as those in the solution of Embodiment I, of the solutions of the flexible antenna structure 100 and the electronic device 200 in the present embodiment are not repeatedly described, and descriptions of differences of the flexible antenna structure 100 and the electronic device 200 in the present embodiment will be emphasized.

In Embodiment III, the non-mm-Wave antenna 30 includes a first part 30a and a second non-mm-Wave antenna 33; the first part 30a and the second part 30b are independent of each other by a distance; and the first part 30a and the second part 30b are further used to be electrically connected to one non-mm-Wave antenna feed source assembly 31, respectively. It can be understood that by means of the arrangement of the two non-mm-Wave antenna units, a usage requirement of two or more non-mm-Wave antennas of the electronic device 200 can be met. The two non-mm-Wave antenna feed source assemblies 31 may be disposed on the main circuit board 2. The first non-mm-Wave antenna unit 32 and the second part 30b are electrically connected to the corresponding non-mm-Wave antenna feed source assemblies 31 on the other side respectively via a conductor 131a of one via hole 131.

Embodiment IV

Figure 20:
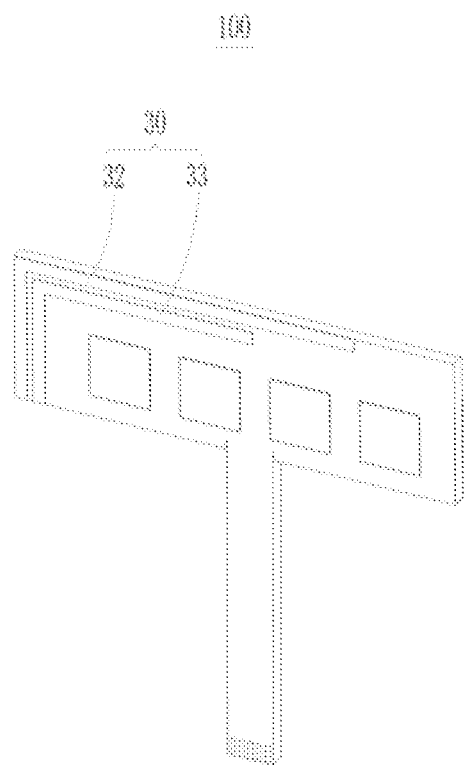
FIG. 20 is a schematic view of a flexible antenna structure disclosed by Embodiment IV of the present disclosure.
Figure 21:
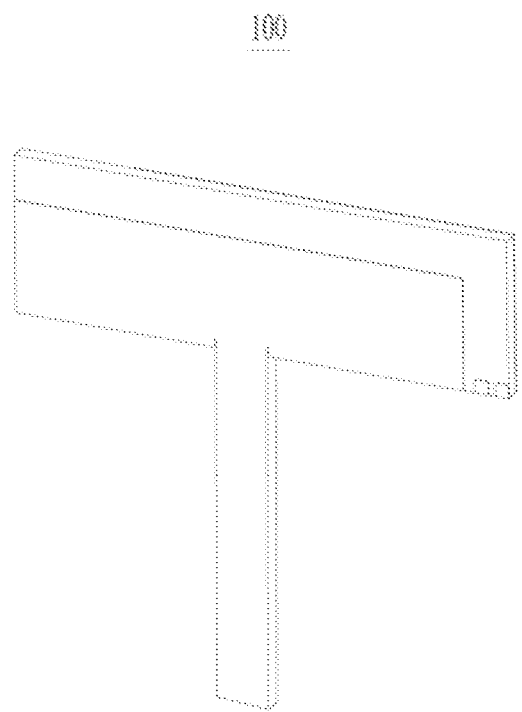
FIG. 21 is a schematic view from another angle of the flexible antenna structure shown in FIG. 20.
Figure 22:
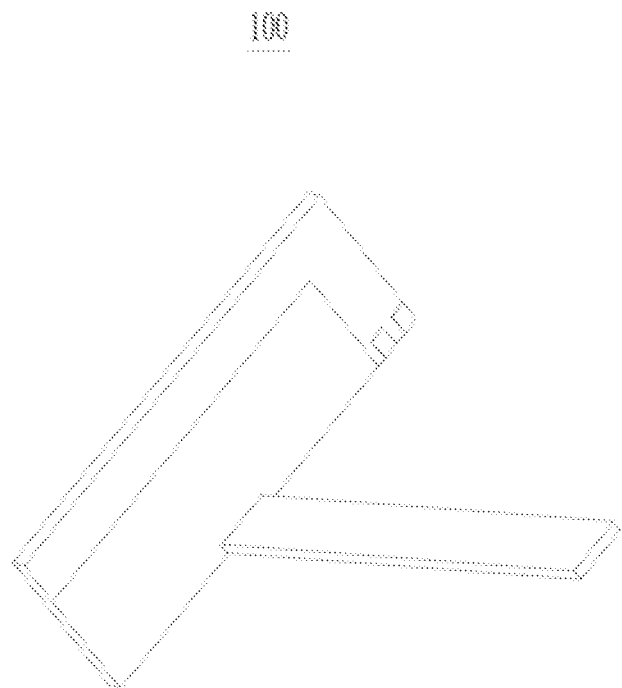
FIG. 22 is a schematic view illustrating that the flexible antenna structure shown in FIG. 20 is in a used state.
Figure 23:
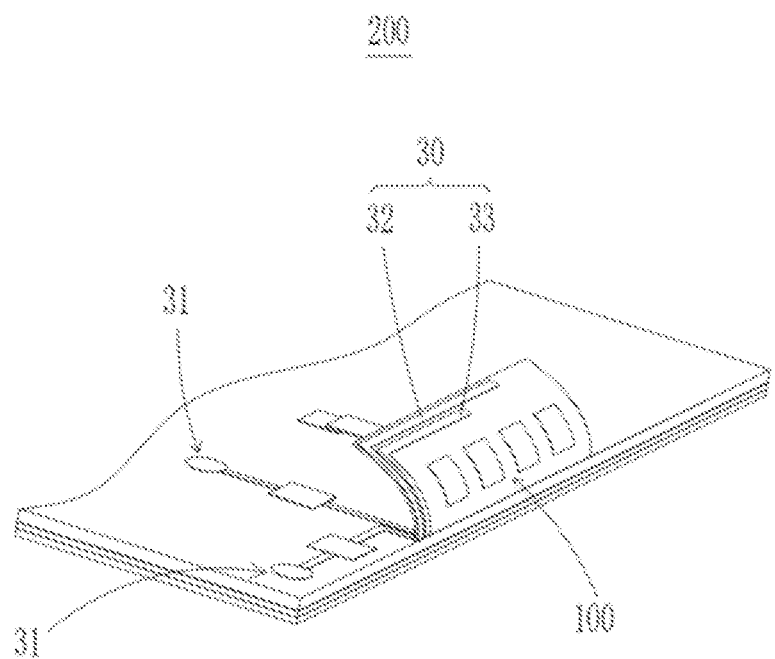
FIG. 23 is schematic view after a shell is removed from an electronic device having the flexible antenna structure shown in FIG. 20.
Figure 24:
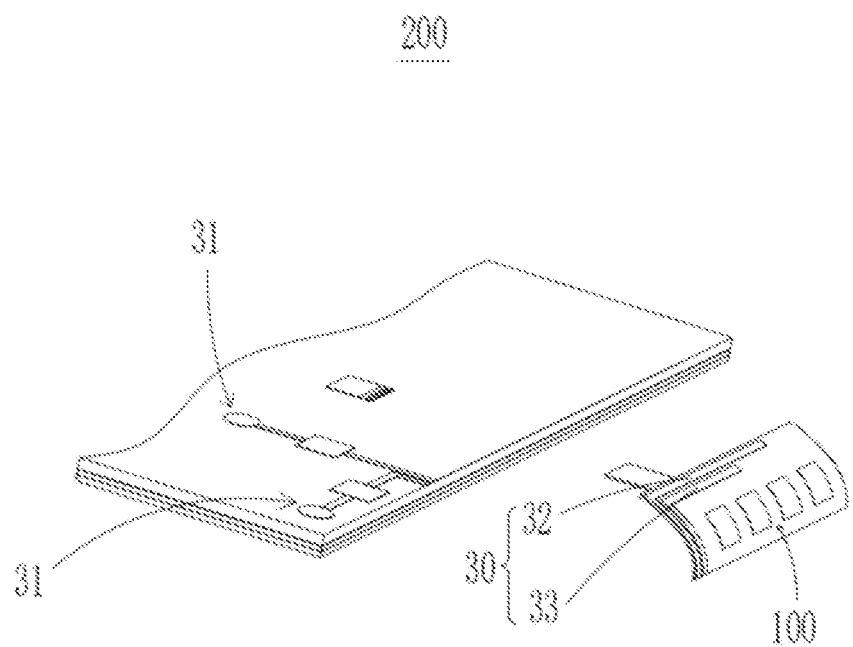
FIG. 24 is an exploded view after a shell is removed from the electronic device shown in FIG. 23.

Referring to FIG. 20, FIG. 21, FIG. 22, FIG. 23, and FIG. 24, FIG. 20 is a schematic view of a flexible antenna structure 100 disclosed in Embodiment IV of the present disclosure; FIG. 21 is a schematic view from another angle of the flexible antenna structure 100 shown in FIG. 20; FIG. 22 is a schematic view illustrating that the flexible antenna structure 100 shown in FIG. 20 is in a used state; FIG. 23 is a schematic view after a shell is removed from an electronic device 200 having the flexible antenna structure 100 shown in FIG. 20; and FIG. 24 is an exploded view after a shell is removed from the electronic device 200 shown in FIG. 23. Parts, which are the same as those in the solution of Embodiment I, of the solutions of the flexible antenna structure 100 and the electronic device 200 in the present embodiment are not repeatedly described, and descriptions of differences of the flexible antenna structure 100 and the electronic device 200 in the present embodiment will be emphasized.

In Embodiment IV, the non-mm-Wave antenna 30 includes a first part 30a and a second non-mm-Wave antenna 33; the first part 30a and the second part 30b are independent of each other by a distance; and the first part 30a and the second part 30b are further used to be electrically connected to one non-mm-Wave antenna feed source assembly 31, respectively. It can be understood that by means of the arrangement of the two non-mm-Wave antenna units, a usage requirement of two or more non-mm-Wave antennas of the electronic device 200 can be met.

In addition, compared with Embodiment I, the first conductive layer 40 and the via hole 132 can be omitted in the flexible antenna structure 100 of Embodiment IV. Compared to Embodiment I and Embodiment III, the flexible antenna structure 100 and the electronic device 200 of Embodiment IV are simpler in structure, the manufacturing process can be simplified, and the size and cost can be further reduced.

Embodiment V

Figure 25:
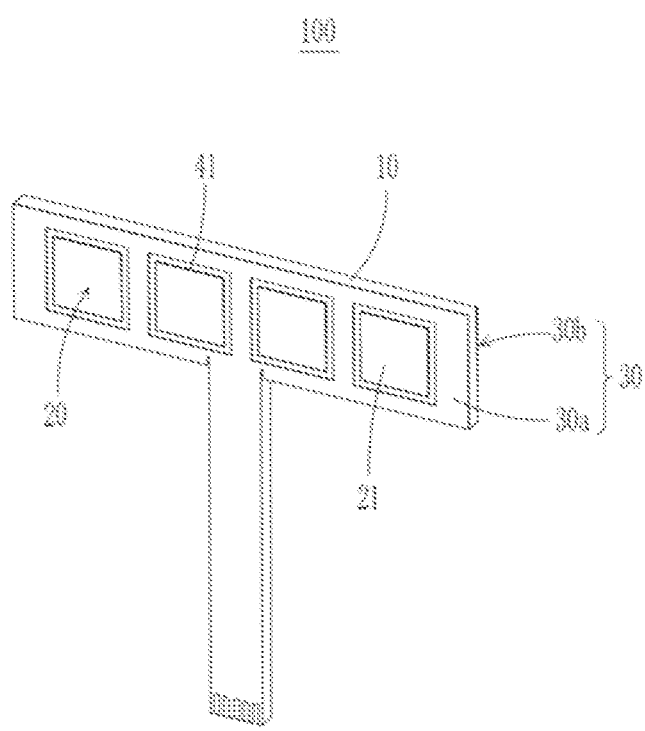
FIG. 25 is a schematic view of a flexible antenna structure disclosed by Embodiment V of the present disclosure.
Figure 26:
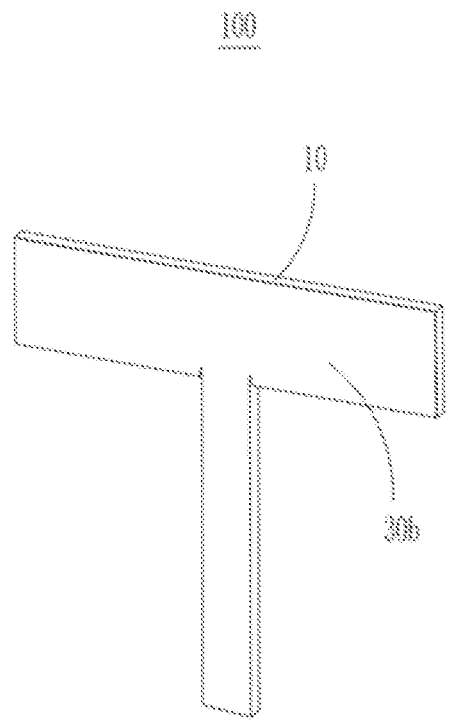
FIG. 26 is a schematic view from another angle of the flexible antenna structure shown in FIG. 25.
Figure 27:
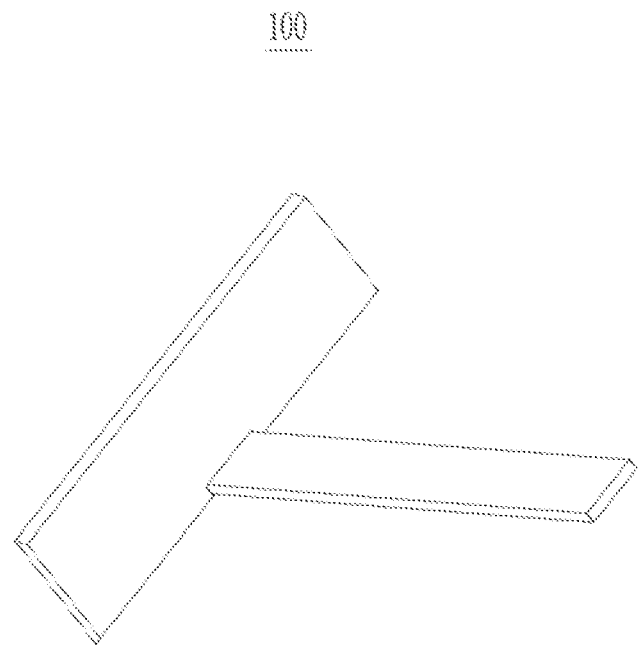
FIG. 27 is a schematic view illustrating that the flexible antenna structure shown in FIG. 25 is in a used state.
Figure 28:
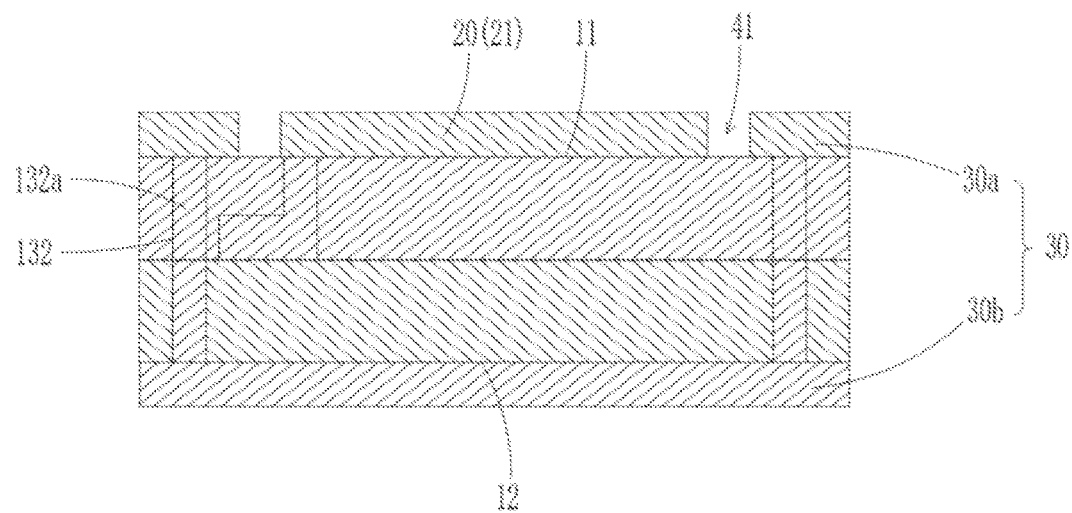
FIG. 28 is a cross-section view of the flexible antenna structure shown in FIG. 25.
Figure 29:
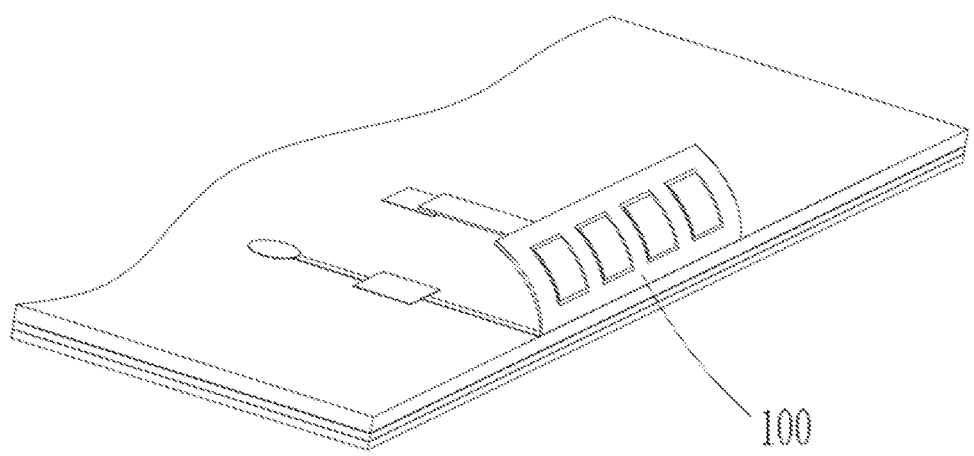
FIG. 29 is a schematic view after a shell is removed from an electronic device having the flexible antenna structure shown in FIG. 25.
Figure 30:
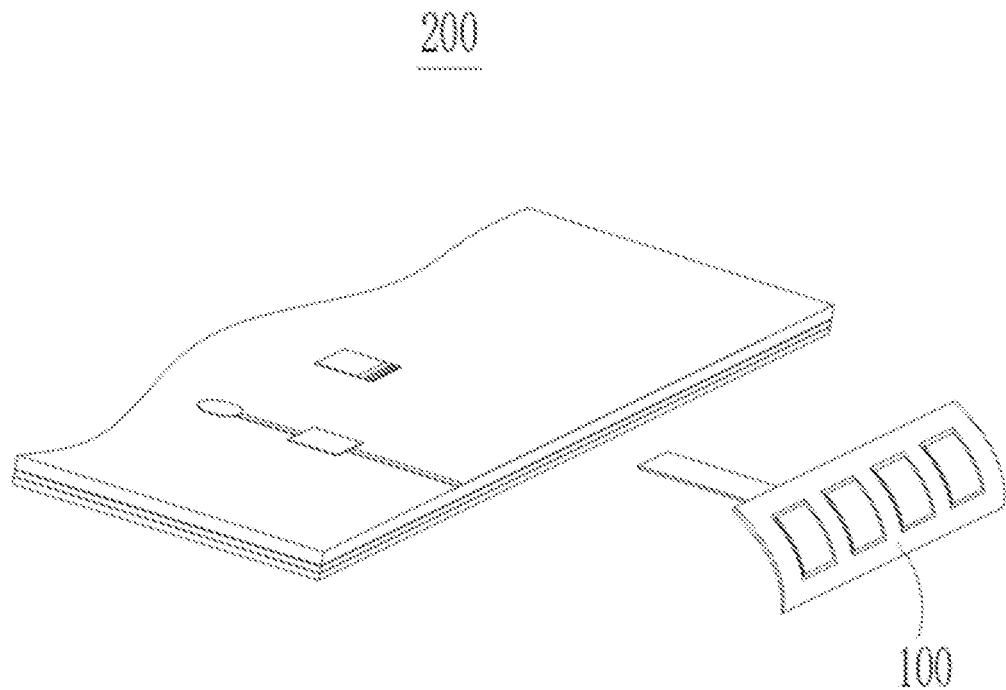
FIG. 30 is an exploded view after a shell is removed from the electronic device shown in FIG. 29.

Referring to FIG. 25 to FIG. 30, FIG. 25 is a schematic view of a flexible antenna structure 100 disclosed by Embodiment V of the present disclosure; FIG. 26 is a schematic view from another angle of the flexible antenna structure 100 shown in FIG. 25; FIG. 27 is a schematic view illustrating that the flexible antenna structure 100 shown in FIG. 25 is in a used state; FIG. 28 is a sectional view of the flexible antenna structure 100 shown in FIG. 25; FIG. 29 is a schematic view after a shell is removed from an electronic device 200 having the flexible antenna structure 100 shown in FIG. 25; and FIG. 30 is an exploded view after a shell is removed from the electronic device 200 shown in FIG. 29 Parts, which are the same as those in the solution of Embodiment I, of the solutions of the flexible antenna structure 100 and the electronic device 200 in the present embodiment are not repeatedly described, and descriptions of differences of the flexible antenna structure 100 and electronic device 200 in the present embodiment will be emphasized.

In Embodiment V, the flexible printed circuit board 10 includes a first surface 11 and a second surface 12 located on a side opposite to the first surface 11, and at least part of the mm-Wave antenna 20 and at least part of the non-mm-Wave antenna 30 are located on the first surface 11 and the second surface 12, respectively. By means of the above-mentioned arrangement, the three-dimensional structure of the flexible printed circuit board 10 can be fully used. Under the same size, functions of the mm-Wave antenna 20 and the non-mm-Wave antenna 30 can be further added, so that the overall flexible antenna structure 100 has a more extreme size, which can improve the comprehensive competitiveness of the overall product.

Specifically, along a direction from the first surface 11 to the second surface 12, the mm-Wave antenna 20 at least partially overlaps the position of at least part of the non-mm-Wave antenna 30. By means of the above arrangement, the flexible antenna structure 100 can be designed to be more compact to increase the space utilization rate, thus improving the comprehensive competitiveness of the product.

The non-mm-Wave antenna 30 includes a first part 30a and a second part 30b. It can be understood that by means of the arrangement of the first part 30a and the second part 30b, a usage requirement of large-sized non-mm-Wave antennas of the existing electronic device can be met.

The first part 30a and the second part 30b are respectively disposed on the first surface 11 and the second surface 12, and can be electrically connected with each other through a via hole 132 running through the flexible printed circuit board 10. It can be understood that the number of the via hole 132 may be two or more, and a conductor 132a is provided in each via hole 132. In addition, the first part 30a and the mm-Wave antenna 20 are disposed on the first surface 11 and are independent of each other by a distance. By the above arrangement, at least part of the mm-Wave antenna 20 and at least part of the non-mm-Wave antenna 30 are distributed on different planes, and spaces on front and back surfaces of the flexible printed circuit board 10 can be fully used, so that the flexible antenna structure 100 has a relatively small planar size, and the comprehensive competitiveness of the entire product can be improved.

The first part 30a has at least one opening region 41, and the mm-Wave antenna is located in the opening region 41. By means of the above arrangement, the flexible antenna structure 100 can be designed to be more compact to increase the space utilization rate, thus improving the comprehensive competitiveness of the product. In one embodiment, the number of the at least one opening region 41 is multiple; the mm-Wave antenna 20 includes a plurality of mm-Wave antenna units 21; and the plurality of mm-Wave antenna units 21 are respectively arranged in the plurality of opening regions 41. By the arrangement of the plurality of mm-Wave antenna units 21, the communication capability of the mm-Wave antenna 20 can be improved to meet the usage requirement of the existing electronic device 200 for the plurality of mm-Wave antennas. The plurality of mm-Wave antenna units 21 are respectively arranged in the plurality of opening regions 41, so that the non-mm-Wave antenna 30 can also effectively improve the signal crosstalk between the plurality of mm-Wave antenna units 21 while realizing a non-mm-Wave signal radiation function, thus enhancing the radiation effect of the mm-Wave antenna 30.

Embodiment VI

Figure 31:
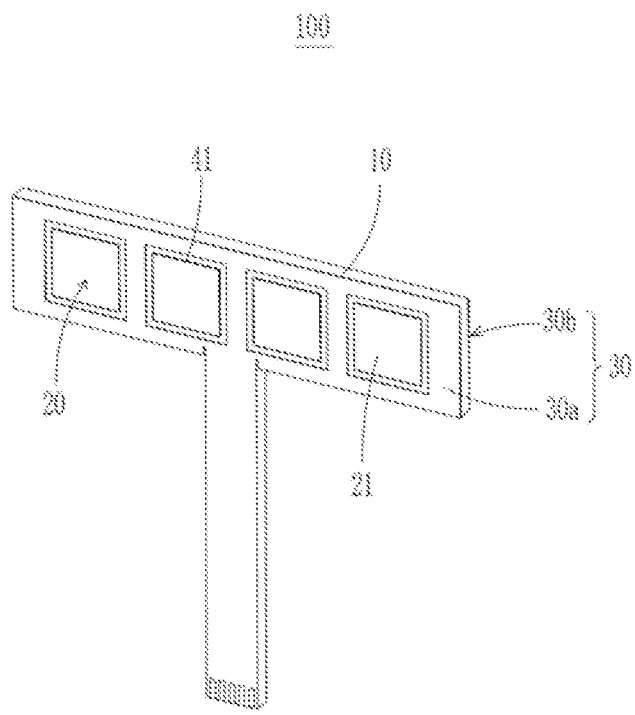
FIG. 31 is a schematic view of a flexible antenna structure disclosed by Embodiment VI of the present disclosure.
Figure 32:
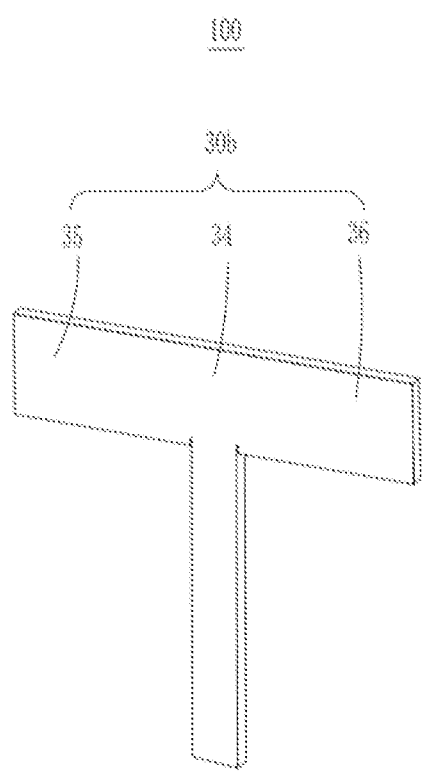
FIG. 32 is a schematic view from another angle of the flexible antenna structure shown in FIG. 31.
Figure 33:
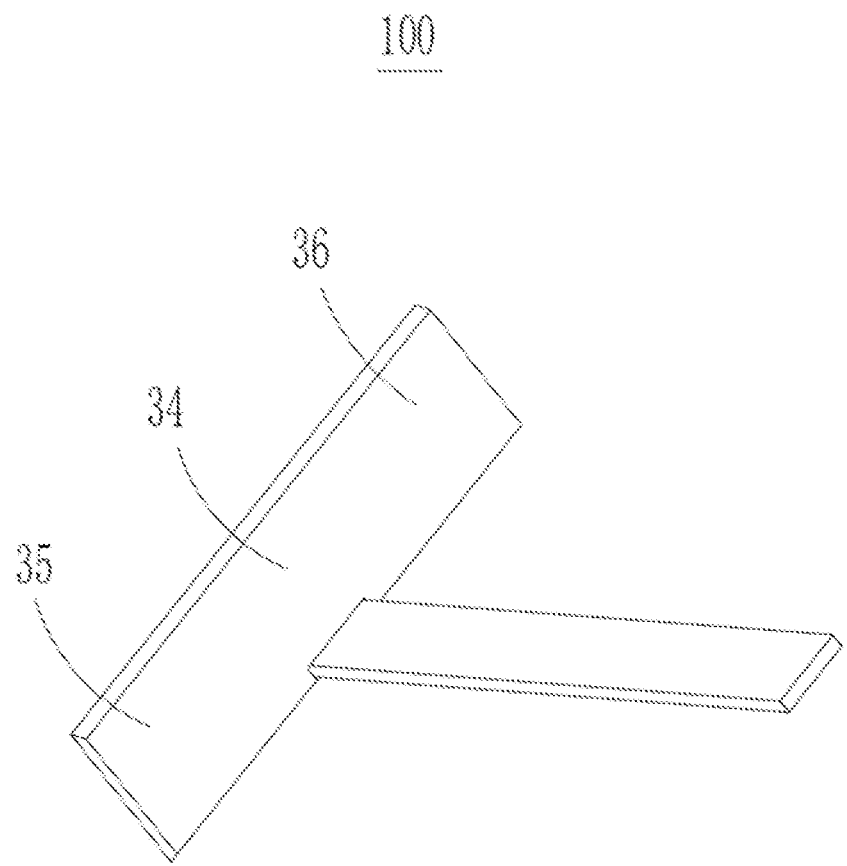
FIG. 33 is a schematic view illustrating that the flexible antenna structure shown in FIG. 31 is in a used state.
Figure 34:
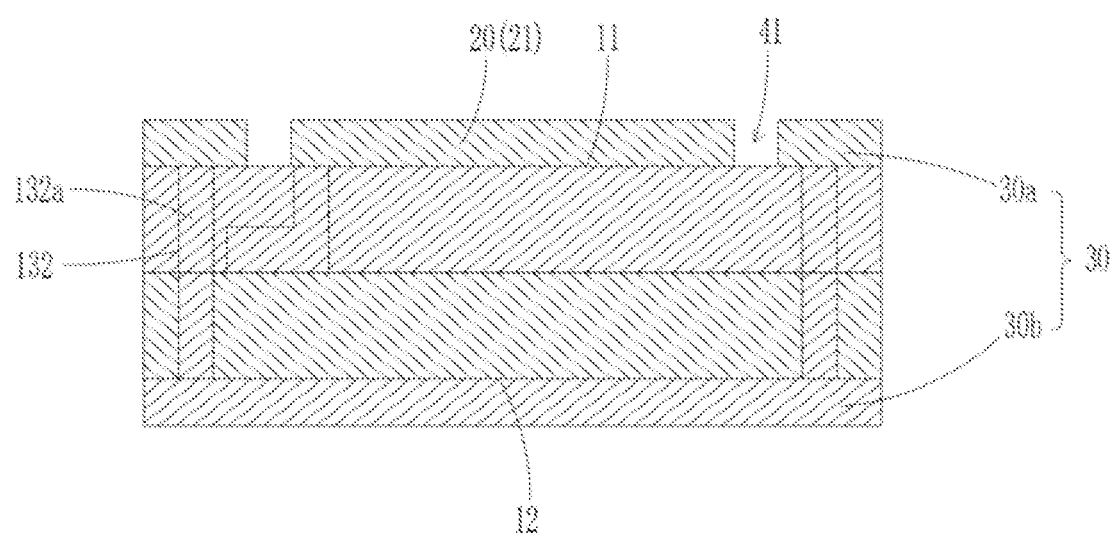
FIG. 34 is a sectional view of the flexible antenna structure shown in FIG. 31.
Figure 35:
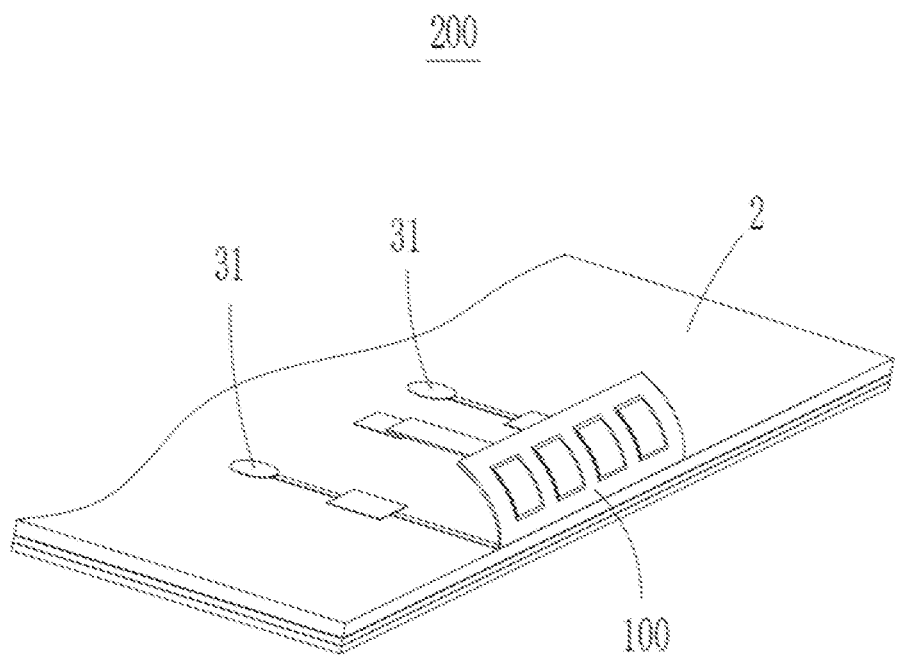
FIG. 35 is a schematic view after a shell is removed from the electronic device of Embodiment VI.
Figure 36:
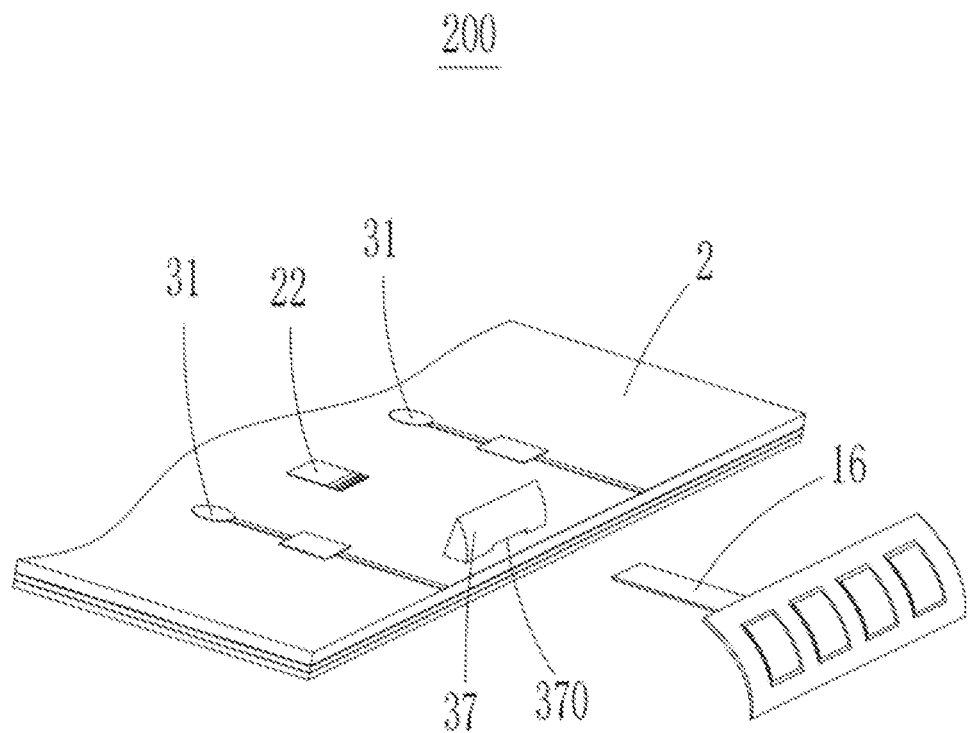
FIG. 36 is an exploded view of an electronic device shown in FIG. 35.
Figure 37:
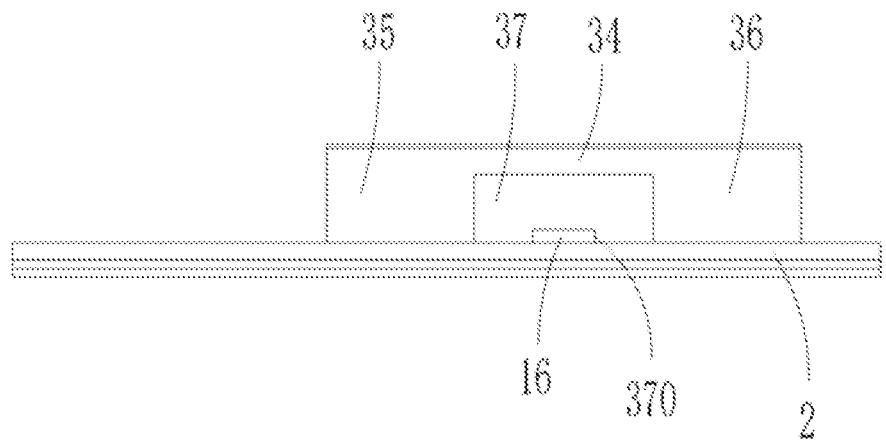
FIG. 37 is a schematic diagram of a back surface of the electronic device shown in FIG. 35.
Figure 38:
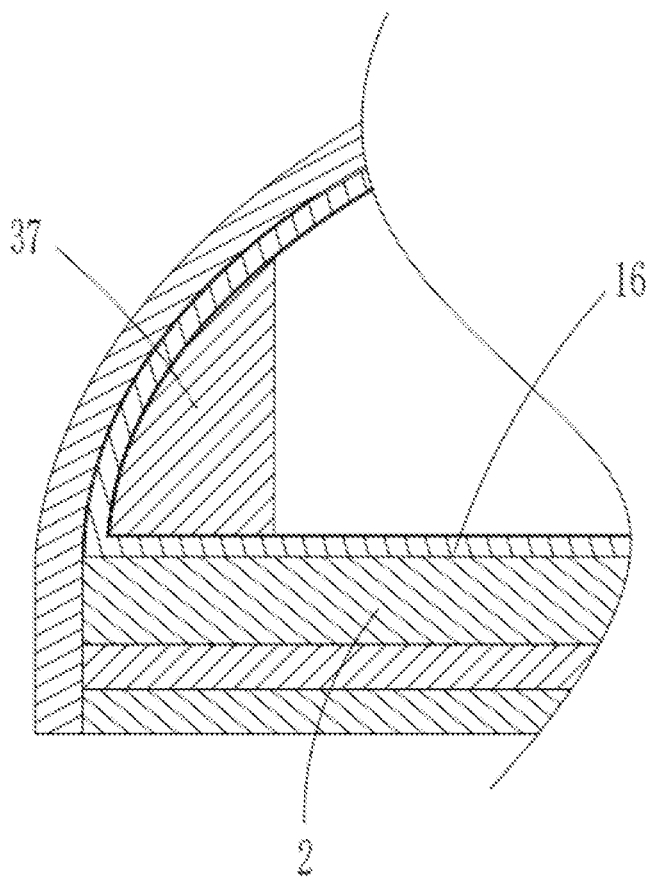
FIG. 38 is a cross-section view of the electronic device shown in FIG. 35.

Referring to FIG. 31 to FIG. 38, FIG. 31 is a schematic view of a flexible antenna structure 100 disclosed by Embodiment VI of the present disclosure; FIG. 32 is a schematic view from another angle of the flexible antenna structure 100 shown in FIG. 31; FIG. 33 is a schematic view illustrating that the flexible antenna structure 100 shown in FIG. 31 is in a used state; FIG. 34 is a sectional view of the flexible antenna structure 100 shown in FIG. 31; FIG. 35 is a schematic view after a shell is removed from the electronic device 200 of Embodiment VI; FIG. 36 is an exploded view of an electronic device 200 shown in FIG. 35; FIG. 37 is a schematic diagram of a back surface of the electronic device 200 shown in FIG. 35; and FIG. 38 is a cross-section view of the electronic device 2200 shown in FIG. 35. Parts, which are the same as those in the solution of Embodiment I, of the solutions of the flexible antenna structure 100 and the electronic device 200 in the present embodiment are not repeatedly described, and descriptions of differences of the flexible antenna structure 100 and the electronic device 200 in the present embodiment VI will be emphasized.

In Embodiment VI, the flexible printed circuit board 10 comprises a first surface 11 and a second surface 12 located on a side opposite to the first surface 11. At least part of the mm-Wave antenna 20 and at least part of the non-mm-Wave antenna 30 are disposed on the first surface 11 and the second surface 12. By the above-mentioned arrangement, the three-dimensional structure of the flexible printed circuit board 10 may be fully used. Under the same size, the functions of the mm-Wave antenna 20 and the non-mm-Wave antenna 30 can be further added so that the size of the entire flexible antenna structure 100 is more accurate, thus improving the comprehensive competitiveness of the entire product.

Specifically, in a direction from the first surface 11 to the second surface 12, the position of at least part of the mm-Wave antenna 20 and the position of at least part of the non-mm-Wave antenna 30 at least partially overlap. By the arrangement of the above-mentioned arrangement, the flexible antenna structure 100 may be designed to be more compact, the space utilization rate is increased, and the comprehensive competitiveness of the product is improved.

The non-mm-Wave antenna 30 includes a first part 30a and a second part 30b. It can be understood that by the arrangement of the first part 30a and the second part 30b, a usage requirement of the existing electronic device for a large-size non-mm-Wave antenna.

The first part 30a and the second part 30b are respectively disposed on the first surface 11 and the second surface 12. The first part 30a and the second part 30b may be electrically connected through a via hole 132 running through the flexible printed circuit board 10. It can be understood that the number of the via hole 132 may be two or more, and each via hole 132 has a conductor 132a inside. In addition, the first part 30a and the mm-Wave antenna 20 are disposed on the first surface 11 and are independent of each other at an interval. By the arrangement of the above arrangement, at least part of the mm-Wave antenna 20 and at least part of the non-mm-Wave antenna 30 are distributed on different planes, and the front and back spaces of the flexible printed circuit board 10 can be fully used, so that the planar size of the flexible antenna structure 100 is relatively small, and the comprehensive competitiveness of the entire product can be improved.

The first part 30a has at least one opening region 41, and the mm-Wave antenna 20 is located in the opening region 41. By means of the above arrangement, the flexible antenna structure 100 can be designed to be more compact to increase the space utilization rate, thereby improving the comprehensive competitiveness of the product. In one embodiment, the number of the at least one opening region 41 is plural. The mm-Wave antenna 20 includes a plurality of mm-Wave antenna units 21 respectively arranged in the plurality of opening regions 41. By the arrangement of the plurality of mm-Wave antenna units 21, the communication capacity of the mm-Wave antenna 20 can be improved, and the usage requirement of the plurality of mm-Wave antennas of the existing electronic device 200 is met. The plurality of mm-Wave antenna units 21 are respectively arranged in the plurality of opening regions 41 so that the non-mm-Wave antenna 30 can effectively improve the signal crosstalk between the plurality of mm-Wave antennas 21 while realizing a non-mm-Wave signal radiation function, and the radiation effect of the mm-Wave antenna 20 is enhanced.

Further, the electronic device 200 includes two non-mm-Wave antenna feed source assemblies 31 and a conductive piece 37. The second part 30b of the non-mm-Wave antenna 30 includes a middle part 34, a first end part 35 connected with the middle part 34, and a second end part 36 connected with the middle part 34. The first end part 35 and the second end part 36 are also used to be electrically connected with one non-mm-Wave antenna feed source assembly 31, respectively. The middle part 34 is also used to be grounded. The middle part 34 is also used to be grounded via a conductive piece 37. The conductive piece 37 can also play a role of isolation. Furthermore, the conductive piece 37 can be a heat conduction isolation block, so that it can discharge heat to the outside while it is grounded. Meanwhile, the conductive piece 37 can also support the flexible antenna structure 100 to make the flexible antenna structure 100 work more stably and firmly. It can be understood that by means of the foregoing arrangement, two ends of one non-mm-Wave antenna 30 (such as the second part 30b located on the second surface) are electrically connected with one non-mm-Wave antenna feed source assembly 31, respectively, to cooperate with the middle part for grounding, and the radiation effect of two non-mm-Wave antennas can be formed. Furthermore, the conductive piece 37 can discharge the heat to the outside while realizing grounding, isolation and supporting, so that the temperature of the flexible antenna structure 100 is lowered, and the product performance and the grip comfort of a user are improved. It can be understood that the conductive isolation block can be provided on the main circuit board 2 and is connected with a ground point on the main circuit board 2.

Further, the bottom of the conductive piece 37 close to the main circuit board 2 may be provided with a groove 370 or an open pore for allowing the extension part 16 to pass through, so as to be electrically connected to the mm-Wave RFIC 22.

Embodiment VII

Figure 39:
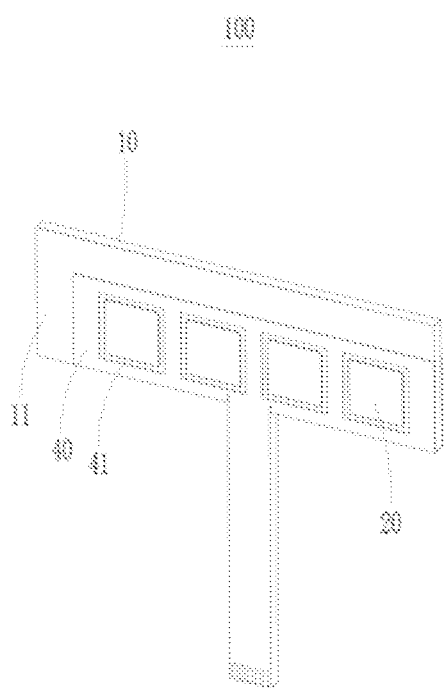
FIG. 39 is a schematic view of a flexible antenna structure disclosed in Embodiment VII of the present disclosure.
Figure 40:
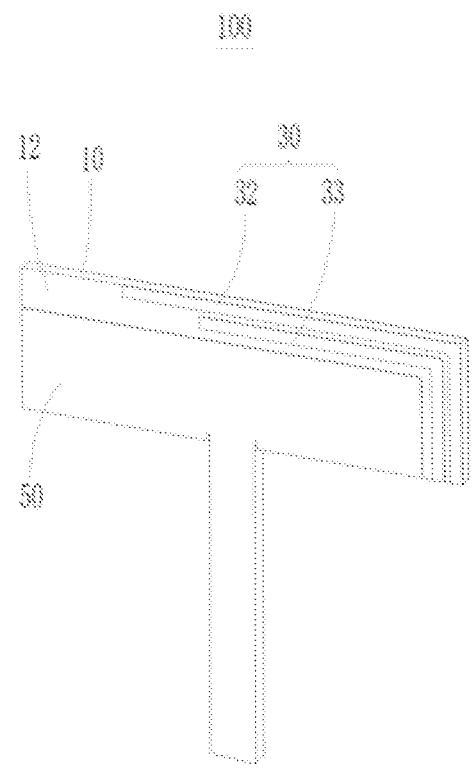
FIG. 40 is a schematic view from another angle of the flexible antenna structure shown in FIG. 39.
Figure 41:
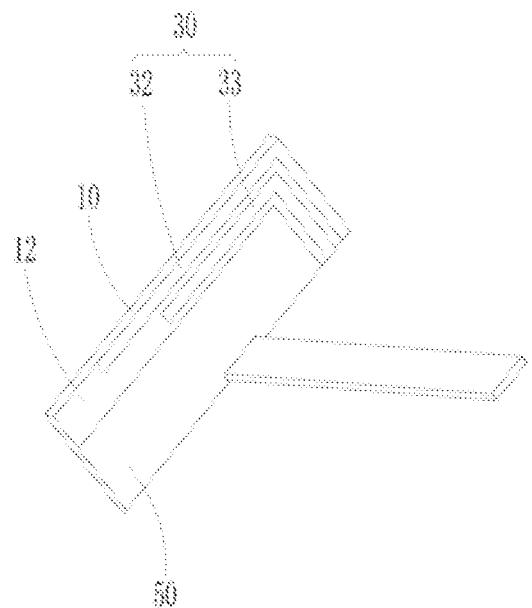
FIG. 41 is a schematic view illustrating that the flexible antenna structure shown in FIG. 39 is in a used state.
Figure 42:
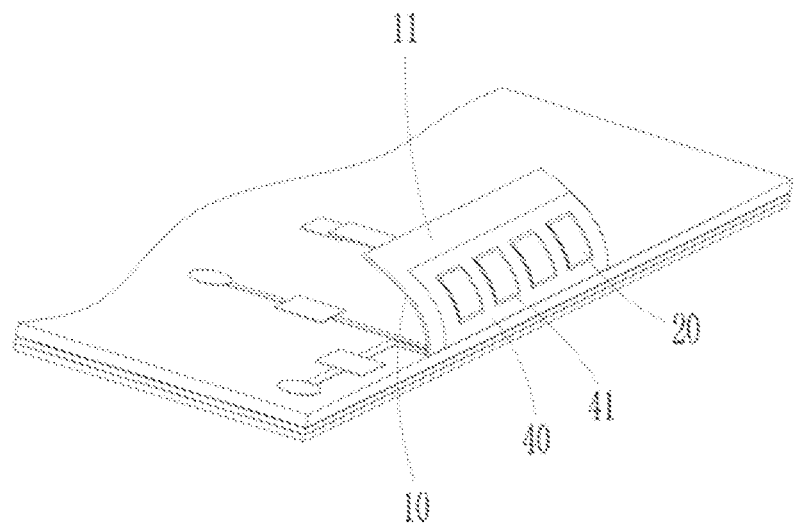
FIG. 42 is a schematic view after a shell is removed from an electronic device having the flexible antenna structure shown in FIG. 39.
Figure 43:
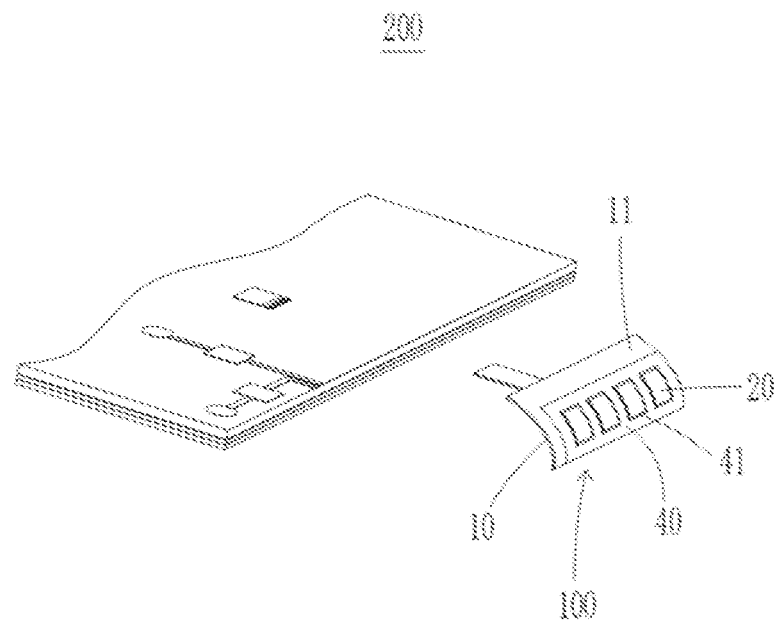
FIG. 43 is an exploded view of the electronic device shown in FIG. 42.

Referring to FIG. 39 to FIG. 43, FIG. 39 is a schematic view of a flexible antenna structure 100 disclosed in Embodiment VII of the present disclosure; FIG. 40 is a schematic view from another angle of the flexible antenna structure 100 shown in FIG. 39; FIG. 41 is a schematic view illustrating that the flexible antenna structure 100 shown in FIG. 39 is in a used state; FIG. 42 is a schematic view after a shell is removed from an electronic device 200 having the flexible antenna structure 100 shown in FIG. 39; and FIG. 43 is an exploded view of the electronic device 200 shown in FIG. 42. The solution of the flexible antenna structure 100 in the present embodiment is approximately the same as that in Embodiment III, and parts which are the same as those in the solution in Embodiment III are not repeatedly described. Descriptions of differences between the flexible antenna structure 100 and the electronic device 200 in the present embodiment VII and the flexible antenna structure 100 and the electronic device 200 of Embodiment III will be emphasized. Compared to Embodiment III, the mm-Wave antenna 20 is disposed on the first surface 11 of the flexible printed circuit board 10, and the first non-mm-Wave antenna unit 32 and the second non-mm-Wave antenna unit 33 of the non-mm-Wave antenna 30 are disposed on the second surface 12 of one side opposite to the mm-Wave antenna 20.

Specifically, in Embodiment VII, the mm-Wave antenna 20 and the non-mm-Wave antenna 30 are respectively disposed on the first surface 11 and the second surface 12. The flexible antenna structure 100 further includes a first conductive layer 40 disposed on the first surface 11, and a second conductive layer 50 disposed on the second surface 12. The first conductive layer 40 includes at least one opening region 41, and the mm-Wave antenna 20 is arranged in the opening region 41. By the arrangement of the first conductive layer 40, the crosstalk between a plurality of mm-Wave antenna signals can be better prevented. Since the mm-Wave antenna 20 is arranged in the opening region 41, the flexible antenna structure 100 can be designed to be more compact to increase the space utilization rate, thus improving the radiation effect of the product.

Embodiment VIII

Figure 44:
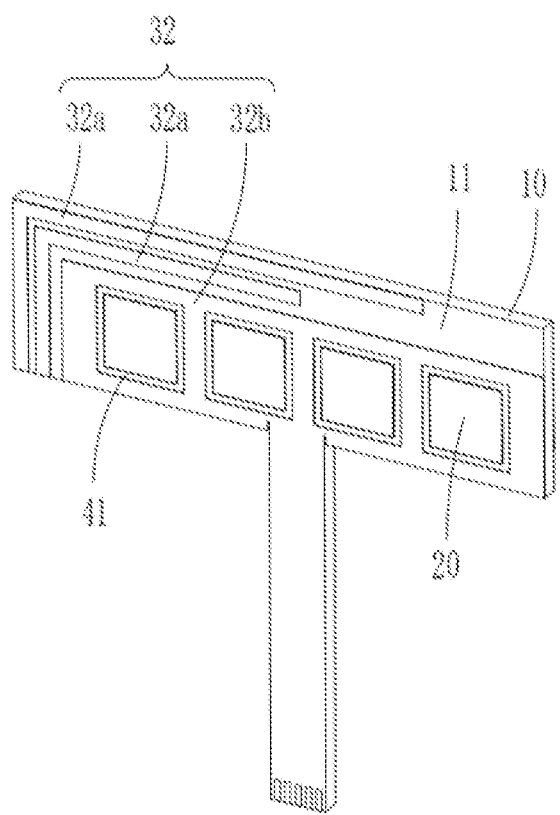
FIG. 44 is a schematic view of a flexible antenna structure disclosed in Embodiment VIII of the present disclosure.
Figure 45:
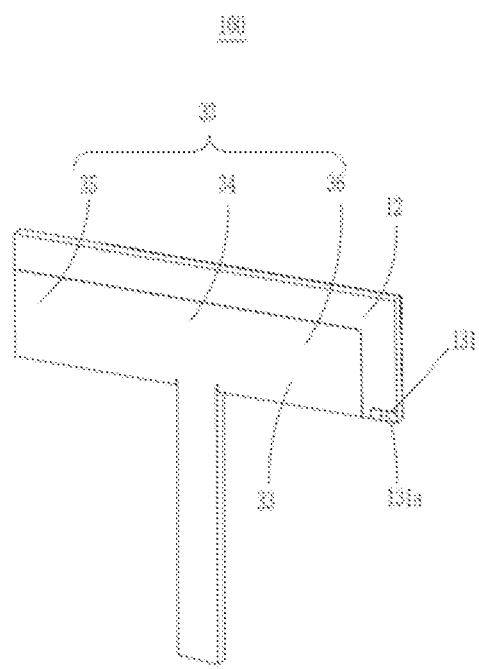
FIG. 45 is a schematic view from another angle of the flexible antenna structure shown in FIG. 44.
Figure 46:
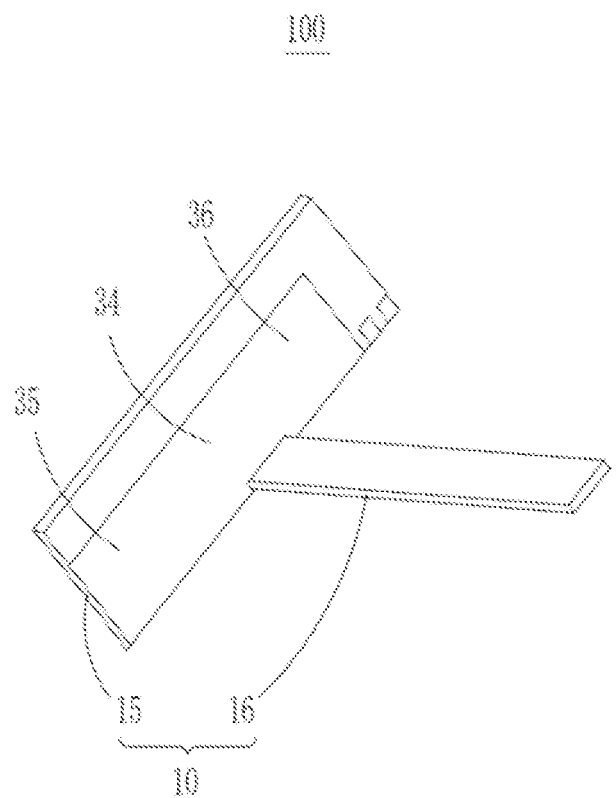
FIG. 46 is a schematic view illustrating that the flexible antenna structure shown in FIG. 44 is in a used state.
Figure 47:
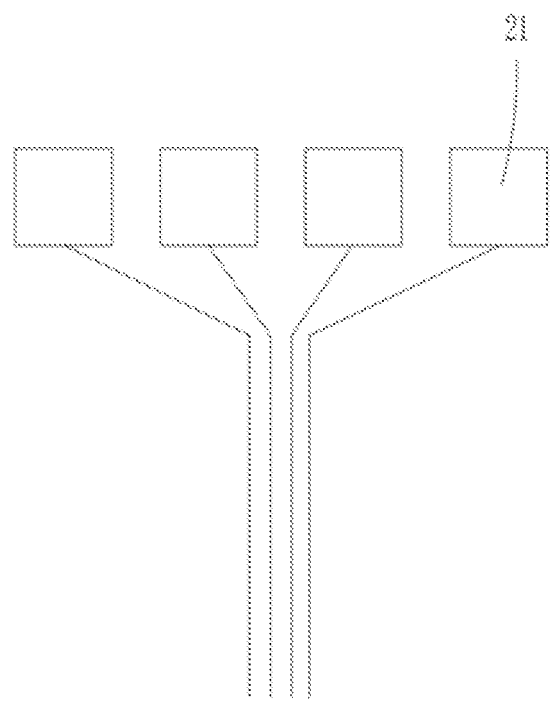
FIG. 47 is a schematic view of electrical connection between a mm-Wave antenna and a conductive line of the flexible antenna structure shown in FIG. 44.
Figure 48:
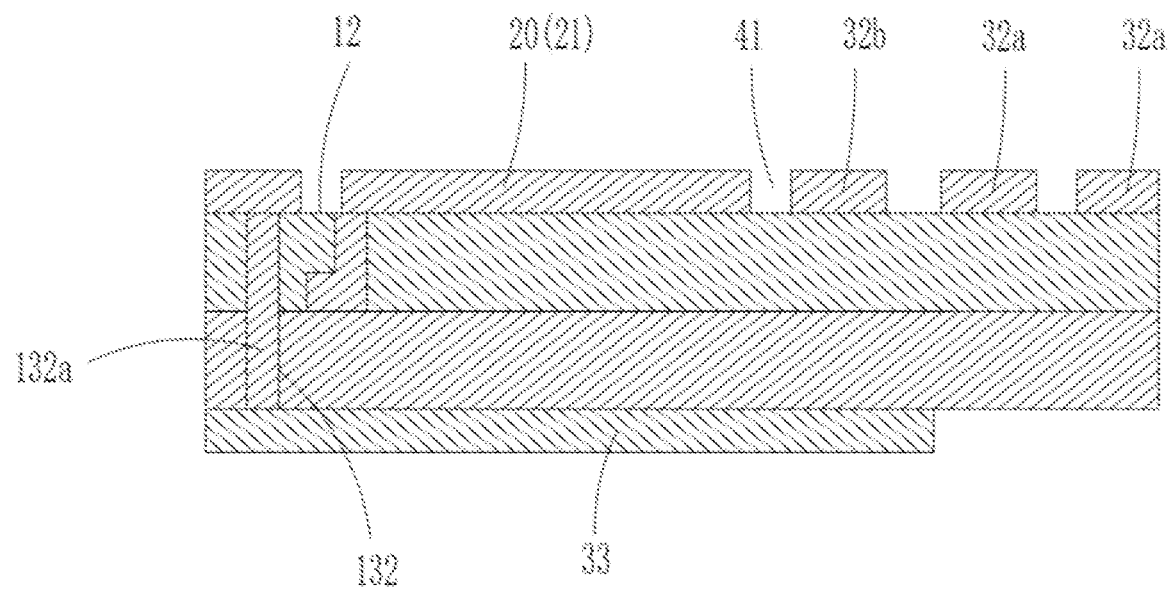
FIG. 48 is a cross-section diagram of the flexible antenna structure shown in FIG. 44.
Figure 49:
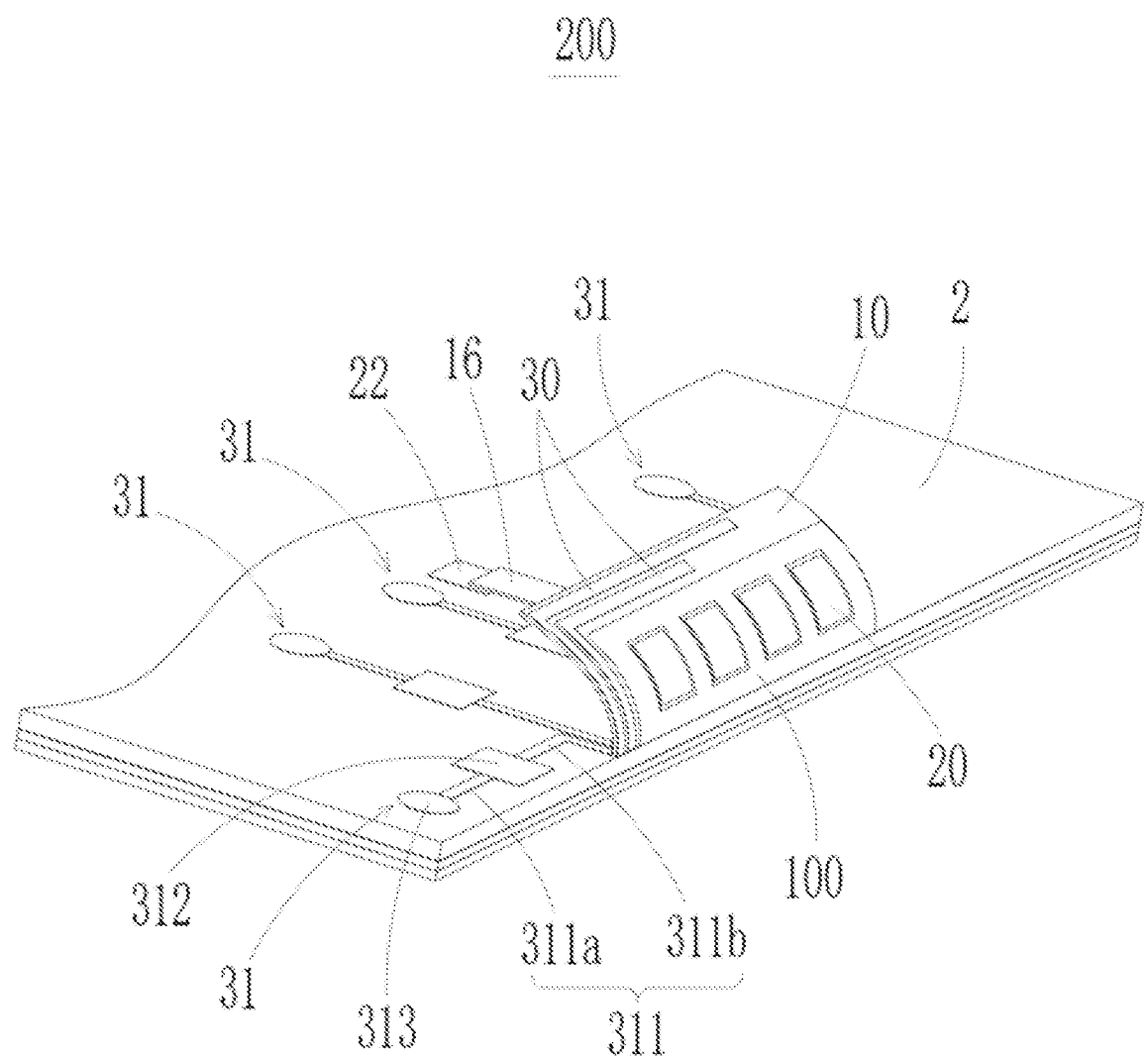
FIG. 49 is a schematic view after a shell is removed from an electronic device having the flexible antenna structure shown in FIG. 44.
Figure 50:
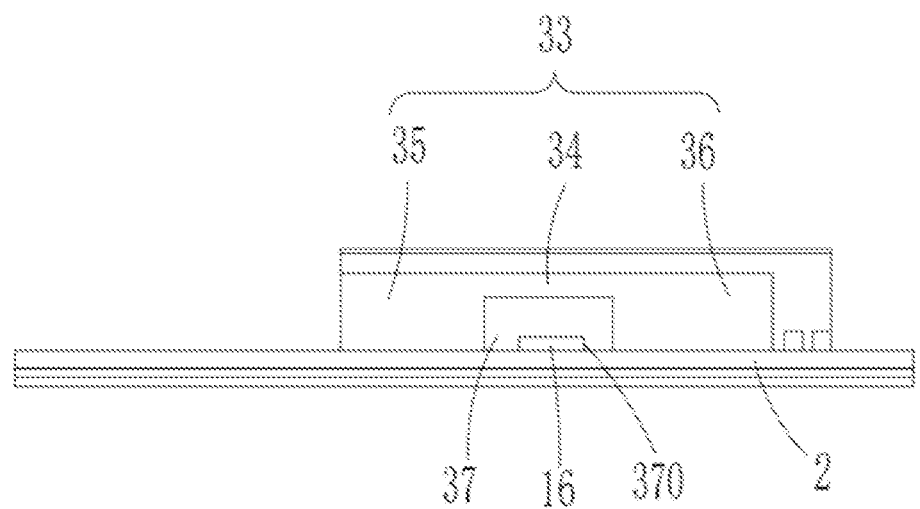
FIG. 50 is a schematic view from another angle of the electronic device shown in FIG. 49.
Figure 51:
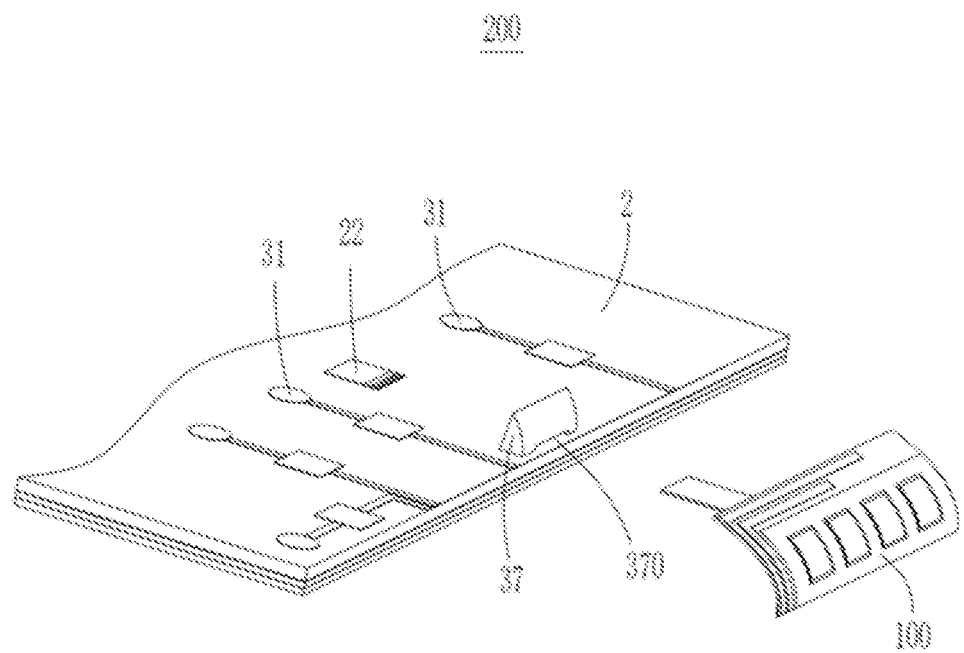
FIG. 51 is an exploded view of the electronic device shown in FIG. 49.
Figure 52:
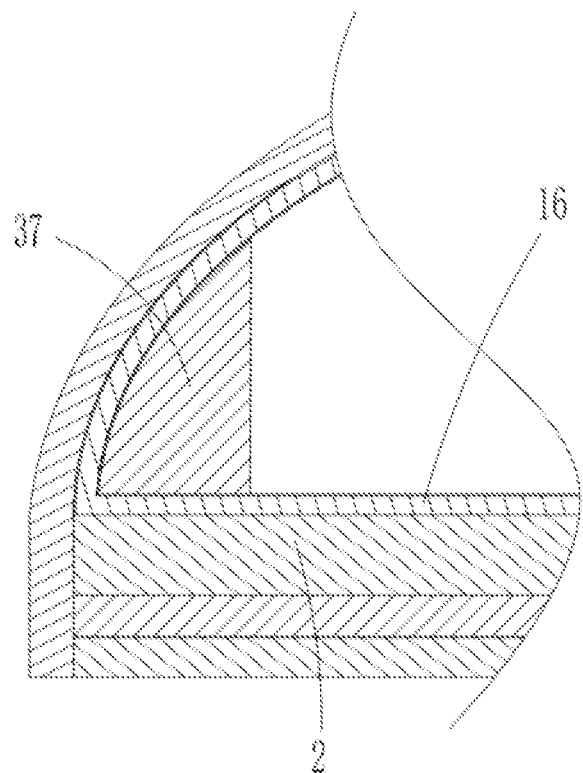
FIG. 52 is a sectional diagram of the electronic device shown in FIG. 49.

Referring to FIG. 44 to FIG. 52, FIG. 44 is a schematic view of a flexible antenna structure 100 disclosed in Embodiment VIII of the present disclosure; FIG. 45 is a schematic view from another angle of the flexible antenna structure 100 shown in FIG. 44; FIG. 46 is a schematic view illustrating that the flexible antenna structure 100 shown in FIG. 44 is in a used state; FIG. 47 is a schematic view of electrical connection between a mm-Wave antenna 20 and a conductive line 14 of the flexible antenna structure 100 shown in FIG. 44; FIG. 48 is a sectional diagram of the flexible antenna structure 100 shown in FIG. 44; FIG. 49 is a schematic view after a shell is removed from an electronic device 200 having the flexible antenna structure 100 shown in FIG. 44; FIG. 50 is a schematic view from another angle of the electronic device 200 shown in FIG. 49; FIG. 51 is an exploded view of the electronic device 200 shown in FIG. 49; and FIG. 52 is a sectional diagram of the electronic device 200 shown in FIG. 49. The solution of the flexible antenna structure 100 and the electronic device 200 in the present embodiment is basically the same as that in Embodiment VI, so the same parts of Embodiment VIII and Embodiment I are not described in detail here. Differences of the flexible antenna structure 100 and the electronic device 200 in Embodiment VIII are mainly described.

In Embodiment VIII, the first surface 11 of the flexible printed circuit board 10 is provided with the mm-Wave antenna 20. The non-mm-Wave antenna 30 includes a first non-mm-Wave antenna unit 32 located on the first surface 11 and a second non-mm-Wave antenna unit 33 located on the second surface 12. The number of the first non-mm-Wave antenna unit 32 can be one or two or more according to an actual need. The present embodiment is schematically described mainly by three first non-mm-Wave antennas 32.

The first non-mm-Wave antenna unit 32a may be located on one side of the mm-Wave antenna 20, as in Embodiment I. The first non-mm-Wave antenna units 32 may be electrically connected, on one side of the second surface 12, to the main circuit board 2 through the via hole 131 running through the flexible printed circuit board 10 and the conductor 131a in the via hole 131. The first non-mm-Wave antenna unit 32b may include at least one opening region 41 so that at least one mm-Wave antenna unit 21 of the mm-Wave antenna 2 is arranged in the at least one opening region 41 and is independent of the second non-mm-Wave antenna unit 32b at an interval (such as the structure in Embodiment V), thereby achieving an effect of effectively reducing crosstalk between mm-Wave antenna signals, so that the flexible antenna structure 100 has a relatively good radiation effect. A more compact mm-Wave antenna structure can be achieved, and the flexible antenna structure 100 is more compact. Further, the first non-mm-Wave antenna unit 32b and the second non-mm-Wave antenna unit 33 may be electrically connected through the via hole 132 running through the flexible printed circuit board 10 and the conductor 132a located in the via hole 132. It can be understood that in the change embodiment, the first non-mm-Wave antenna unit 32b may also be replaced by the first conductive layer 40 in the first embodiment, so the first conductive layer 40 is grounded.

The second non-mm-Wave antenna unit 33 is located on the second surface 12 and is used to be electrically connected with feed source assemblies 31 of at least two non-mm-Wave antennas respectively and grounded to enable the second non-mm-Wave antenna unit 33 to form at least two non-mm-Wave antennas to realize independent transmission and receiving of at least two non-mm-Wave antenna signals and achieve a radiation effect of at least two non-mm-Wave antennas. Specifically, in the present embodiment, the second non-mm-Wave antenna unit 33 includes a middle part 34, a first end part 35 connected with the middle part 34, and a second end part 36 connected with the middle part 34. The first end part 35 and the second end part 36 are also used to be electrically connected with one non-mm-Wave antenna feed source assembly 31, respectively. The middle part 34 is also used to be grounded. The middle part 34 is also used to be grounded via a conductive piece 37. The conductive piece 37 can also play a role of isolation. Furthermore, the conductive piece 37 can be a heat conduction isolation block, so that it can discharge heat to the outside while it is grounded. Meanwhile, the conductive piece 37 can also support the flexible antenna structure 100 to make the flexible antenna structure 100 work more stably and firmly. It can be understood that by means of the foregoing arrangement, two ends of one non-mm-Wave antenna 30 are electrically connected with one non-mm-Wave antenna feed source assembly 31, respectively, to cooperate with the middle part for grounding, and the radiation effect of two non-mm-Wave antennas can be formed. Furthermore, the conductive piece 37 can discharge the heat to the outside while realizing grounding, isolation and supporting, so that the temperature of the flexible antenna structure 100 is lowered, and the product performance and the grip comfort of a user are improved. It can be understood that the conductive isolation block can be provided on the main circuit board 2 and is connected with a ground point on the main circuit board 2. In addition, the structure and effect of the conductive isolation block in Embodiment VIII is basically the same as those of the conductive isolation block in Embodiment VI, and descriptions thereof are omitted here. In the present embodiment, the second non-mm-Wave antenna unit 33 can achieve a radiation effect of two non-mm-Wave antennas, and in combination with the two first non-mm-Wave antenna units 32a, the flexible antenna structure 100 has a plurality of non-mm-Wave antennas, so that the need for a plurality of non-mm-Wave antennas of the existing electronic device is met.

Figure 53:
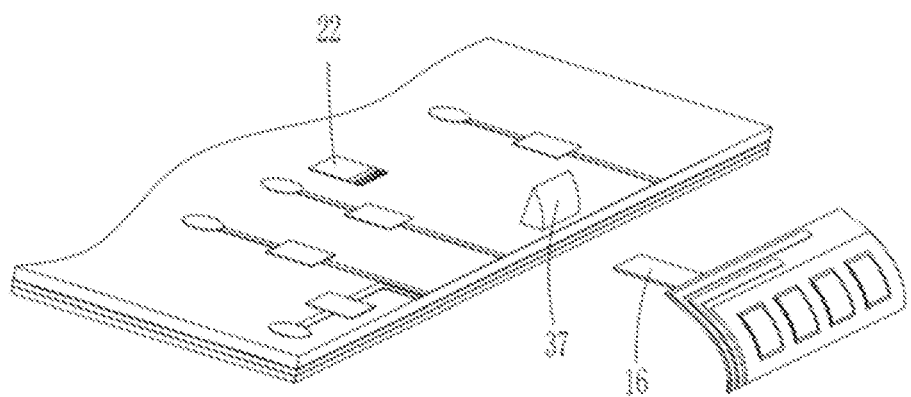
FIG. 53 is a schematic view of a change embodiment of the electronic device shown in FIG. 51.

Further, as shown in FIG. 49 to FIG. 52, the bottom of the conductive piece 37 close to the main circuit board 2 may be provided with a groove 370 or an open pore for allowing the extension part 16 to pass through, so as to be electrically connected to the mm-Wave radio-frequency integrated circuit. However, in one change embodiment, referring to FIG. 53, FIG. 53 is a schematic view of one change embodiment of the electronic device 200 shown in FIG. 51. When the conductive piece 37 is staggered from the extension part 16, the bottom of the conductive piece 37 close to the main circuit board 2 does not need to be provided with a groove or an open pore. Similarly, in Embodiment VI, when the conductive piece 37 is staggered from the extension part 16, the bottom of the conductive piece 37 close to the main circuit board 2 does not need to be provided with a groove or an open pore.

Embodiment IX

Figure 54:
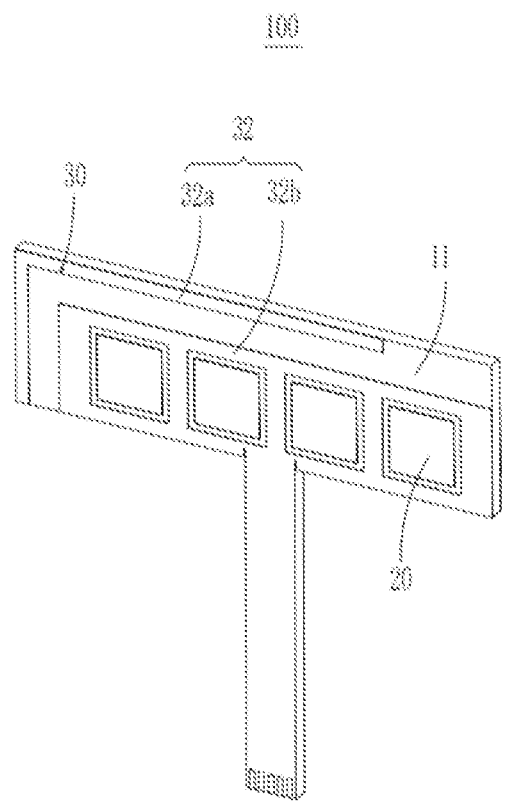
FIG. 54 is a schematic view of a flexible antenna structure disclosed in Embodiment IX of the present disclosure.
Figure 55:
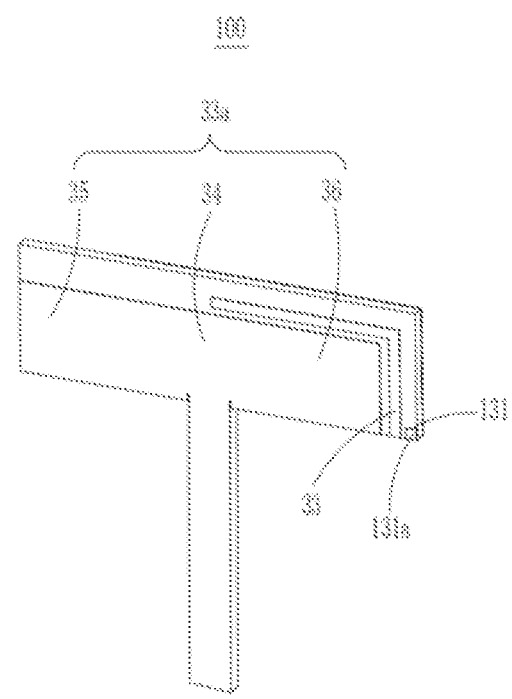
FIG. 55 is a schematic view from another angle of the flexible antenna structure shown in FIG. 54.
Figure 56:
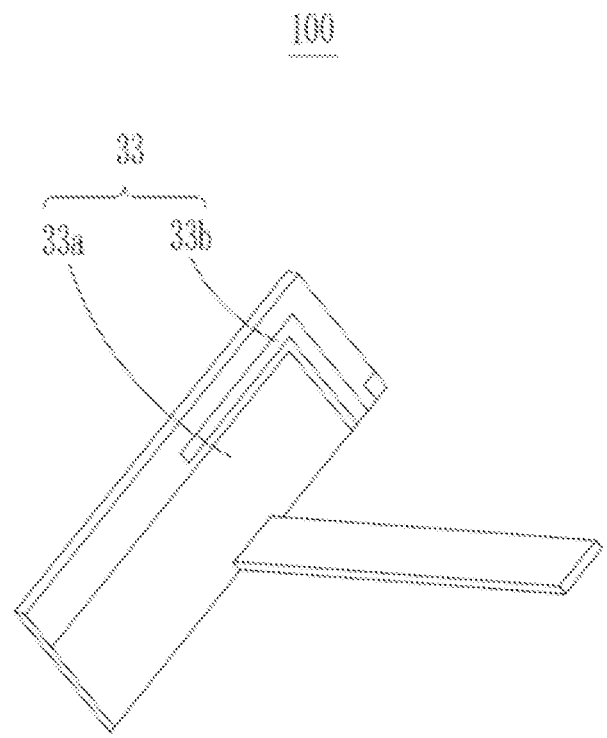
FIG. 56 is a schematic view illustrating that the flexible antenna structure shown in FIG. 54 is in a used state.
Figure 57:
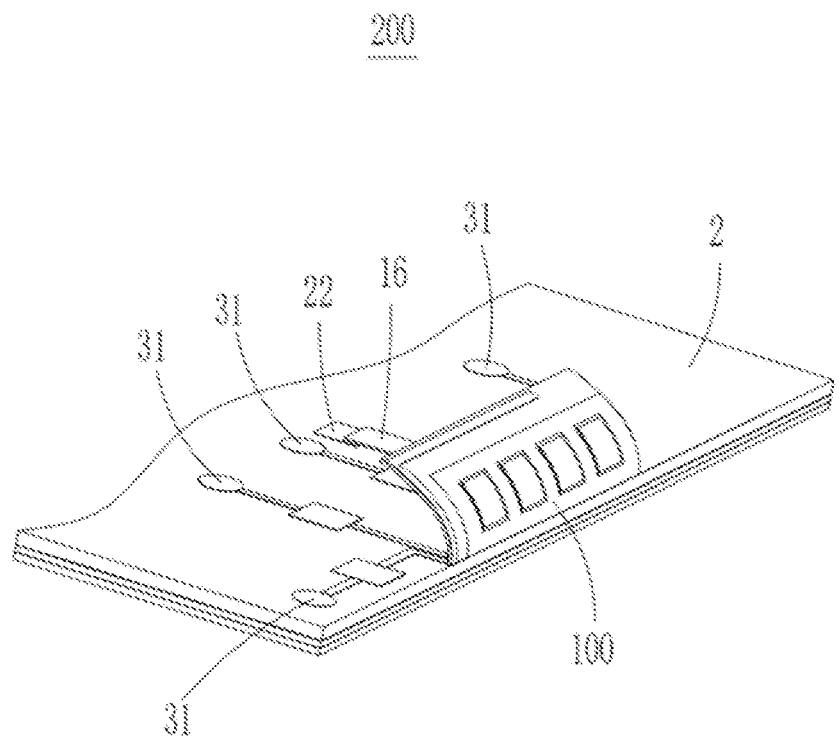
FIG. 57 is a schematic view after a shell is removed from an electronic device having the flexible antenna structure shown in FIG. 54.
Figure 58:
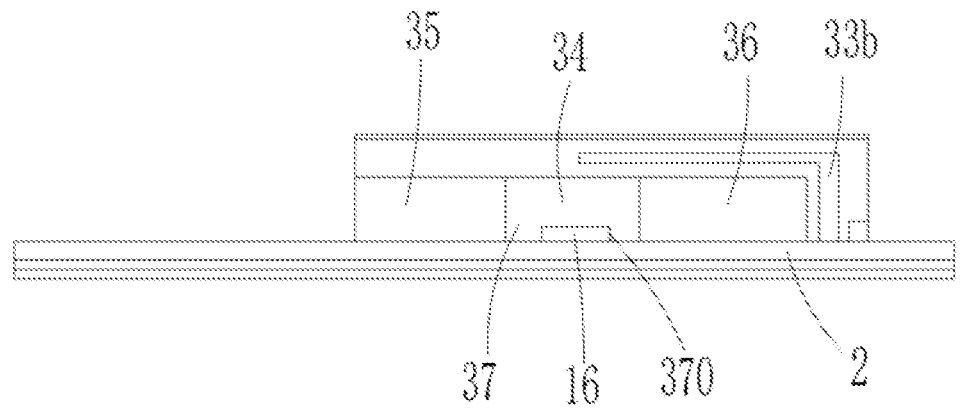
FIG. 58 is a schematic view from another angle of the electronic device shown in FIG. 57.
Figure 59:
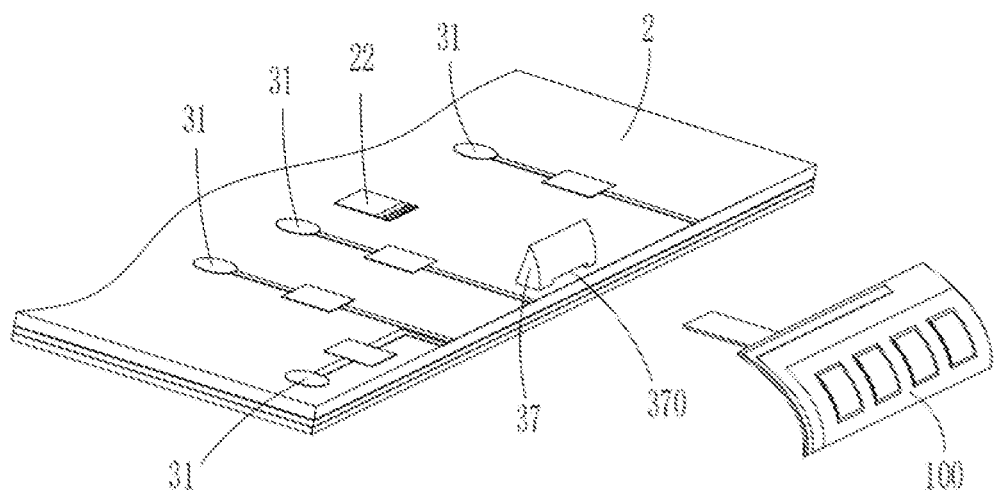
FIG. 59 is an exploded view of the electronic device shown in FIG. 57.

Referring to FIG. 54 to FIG. 60, FIG. 54 is a schematic view of a flexible antenna structure 100 disclosed in Embodiment IX of the present disclosure; FIG. 55 is a schematic view from another angle of the flexible antenna structure 100 shown in FIG. 54; FIG. 56 is a schematic view illustrating that the flexible antenna structure 100 shown in FIG. 54 is in a used state; FIG. 57 is a schematic view after a shell is removed from an electronic device 200 having the flexible antenna structure 100 shown in FIG. 54; FIG. 58 is a schematic view from another angle of the electronic device 200 shown in FIG. 57; and FIG. 59 is an exploded view of the electronic device 200 shown in FIG. 57. The solution of the flexible antenna structure 100 and the electronic device 200 in the present embodiment is basically the same as that in Embodiment VIII, and parts, which are the same as those in the solution in Embodiment VIII, in the solution of the present embodiment IX are not repeatedly described. Descriptions of differences of the flexible antenna structure 100 and the electronic device 200 in the present embodiment will be emphasized.

In Embodiment IX, the first surface 11 of the flexible printed circuit board 10 is provided with a mm-Wave antenna 20. The non-mm-Wave antenna 30 includes a first non-mm-Wave antenna unit 32 located on the first surface 11 and a second non-mm-Wave antenna unit 33 located on the second surface 12. The number of the first non-mm-Wave antenna unit 32 may be set to be one or two or more according to an actual need (such as two first non-mm-Wave antenna units 32a, 32b). The number of the second non-mm-Wave antenna unit 33 may be set to be one or two or more according to an actual need. The present embodiment is mainly schematically described by taking two first non-mm-Wave antenna units 32 and two second non-mm-Wave antenna units 33.

The first non-mm-Wave antenna unit 32a may be located on one side of the mm-Wave antenna 20, as in Embodiment I. The first non-mm-Wave antenna units 32 may be electrically connected, on one side of the second surface 12, to the main circuit board 2 through the via hole 131 running through the flexible printed circuit board 10 and the conductor 131*a* in the via hole 131. The first non-mm-Wave antenna units 32*b* may include at least one opening region 41 so that at least one mm-Wave antenna unit 21 of the mm-Wave antenna 2 is arranged in the at least one opening region 41 and is independent of the second non-mm-Wave antenna unit 32*b* at an interval (such as the structure in Embodiment V), thereby achieving an effect of effectively reducing crosstalk between mm-Wave antenna signals, so that the flexible antenna structure 100 has a relatively good radiation effect. A more compact mm-Wave antenna structure can be achieved, and the flexible antenna structure 100 is more compact. Further, the first non-mm-Wave antenna unit 32*b* and the second non-mm-Wave antenna unit 33 may be electrically connected through the via hole 132 running through the flexible printed circuit board 10 and the conductor 132*a* located in the via hole 132. It can be understood that in the change embodiment, the first non-mm-Wave antenna unit 32*b* may also be replaced by the first conductive layer 40 in the first embodiment, so the first conductive layer 40 is grounded.

The number of the second non-mm-Wave antenna units 33 may be two. The two second non-mm-Wave antenna units 33 are independent of each other at an interval. One second non-mm-Wave antenna unit 33*a* may correspond to the position of the first non-mm-Wave antenna unit 32*b* and the position of the mm-Wave antenna 20, and the other second non-mm-Wave antenna unit 33*b* may be located on one side of the second non-mm-Wave antenna unit 33*a*.

The second non-mm-Wave antenna unit 33*a* is used to be electrically connected to at least two non-mm-Wave antenna feed source assemblies 31 and grounded, so that the second non-mm-Wave antenna unit 33*b* forms at least two non-mm-Wave antennas, i.e., independent transmission and receiving of at least two non-mm-Wave antenna signals are realized, and a radiation effect of at least two non-mm-Wave antennas is achieved. Specifically, in the present embodiment, the second non-mm-Wave antenna unit 33 includes a middle part 34, a first end part 35 connected with the middle part 34, and a second end part 36 connected with the middle part 34. The first end part 35 and the second end part 36 are also used to be electrically connected with one non-mm-Wave antenna feed source assembly 31, respectively. The middle part 34 is also used to be grounded. The middle part 34 is also used to be grounded via a conductive piece 37. The conductive piece 37 can also play a role of isolation. Furthermore, the conductive piece 37 can be a heat conduction isolation block, so that it can discharge heat to the outside while it is grounded. Meanwhile, the conductive piece 37 can also support the flexible antenna structure 100 to make the flexible antenna structure 100 work more stably and firmly. It can be understood that by means of the foregoing arrangement, two ends of one non-mm-Wave antenna 30 are electrically connected with one non-mm-Wave antenna feed source assembly 31, respectively, to cooperate with the middle part for grounding, and the radiation effect of two non-mm-Wave antennas can be formed. Furthermore, the conductive piece 37 can discharge the heat to the outside while realizing grounding, isolation and supporting, so that the temperature of the flexible antenna structure 100 is lowered, and the product performance and the grip comfort of a user are improved. It can be understood that the conductive isolation block can be provided on the main circuit board 2 and is connected with a ground point on the main circuit board 2. In addition, the conductive isolation block in the present embodiment IX can be basically the same as the structure and function of the conductive isolation block in Embodiment VI, and descriptions thereof are omitted. In the present embodiment, the second non-mm-Wave antenna unit 33 can form the radiation effect of two non-mm-Wave antenna, and in combination with the two first non-mm-Wave antenna units 32*a*, the flexible antenna structure 100 has a plurality of non-mm-Wave antennas and meets the need for a plurality of non-mm-Wave antennas of the existing electronic device.

Figure 60:
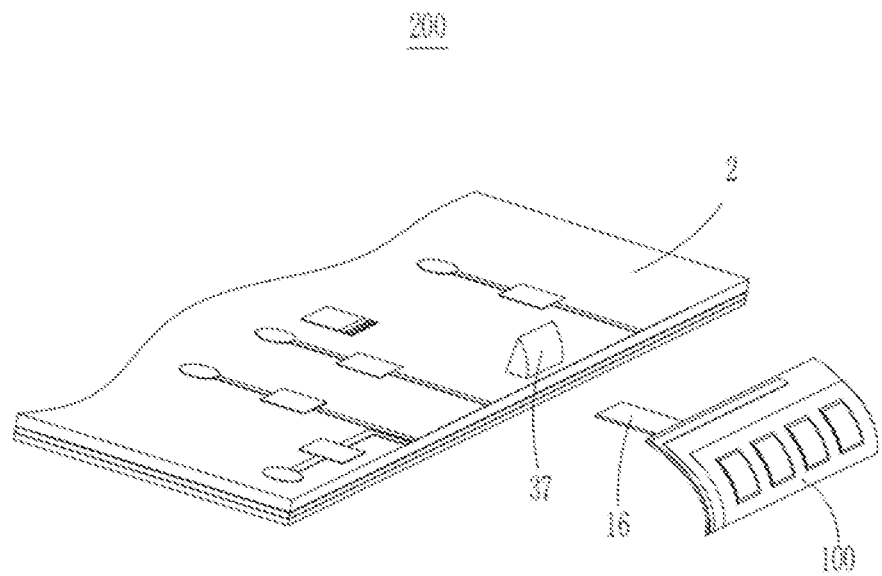
FIG. 60 is a schematic view of a change embodiment of the electronic device shown in FIG. 59.
Figure 61:
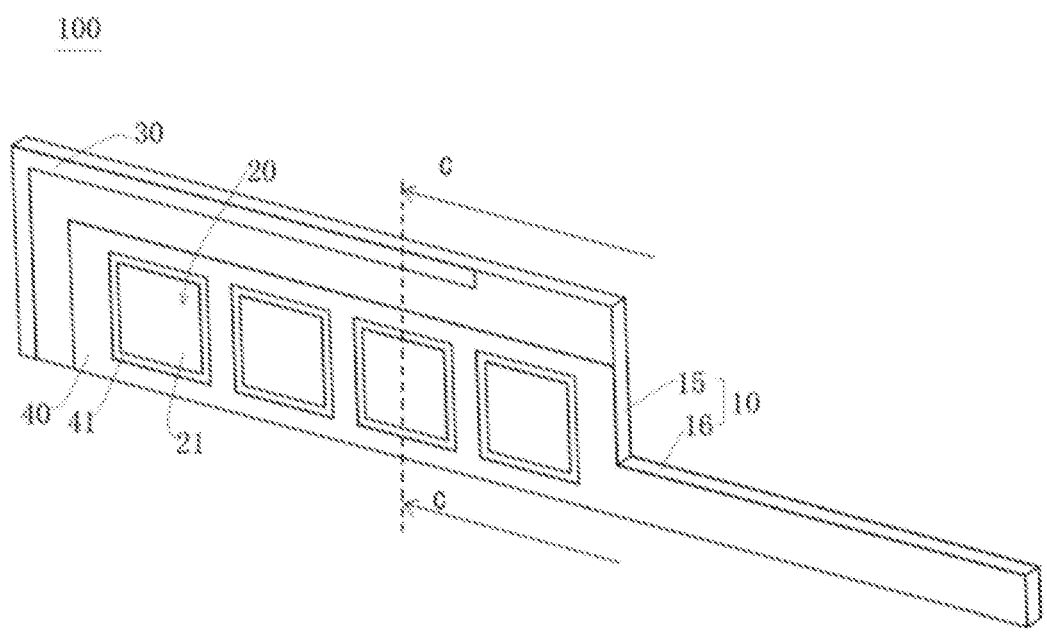
FIG. 61 is a schematic view of a flexible antenna structure disclosed in Embodiment X of the present disclosure.

Further, as shown in FIG. 57 to FIG. 59, the bottom of the conductive piece 37 close to the main circuit board 2 may be provided with a groove 370 or an open pore for allowing the extension part 16 to pass through, so as to be electrically connected to the mm-Wave RFIC 22. However, in one change embodiment, referring to FIG. 60, FIG. 60 is a schematic view of a change embodiment of the electronic device 200 shown in FIG. 59. When the conductive piece 37 is staggered from the extension part 16, the bottom of the conductive piece 37 close to the main circuit board 2 does not need to be provided with a groove or an open pore.

Embodiment X

Figure 62:
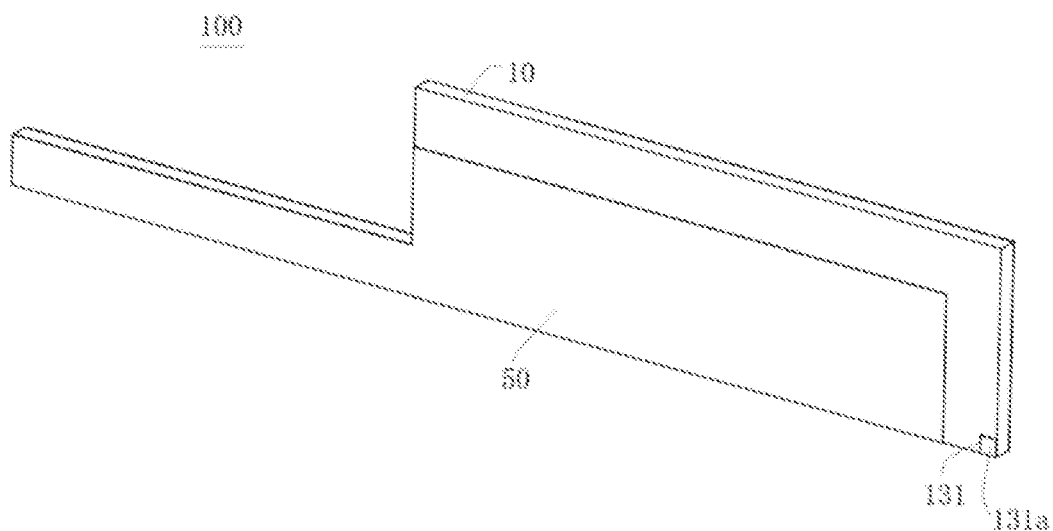
FIG. 62 is a schematic view from another angle of the flexible antenna structure shown in FIG. 61.
Figure 63:
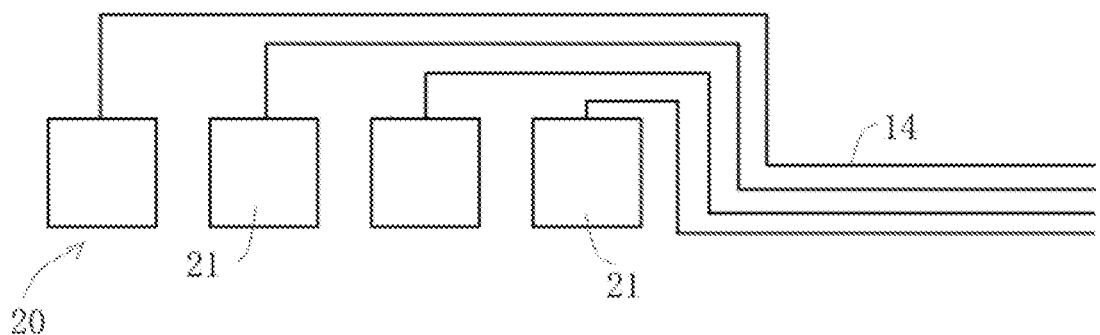
FIG. 63 is a schematic view of electrical connection between a mm-Wave antenna and a conductive line of the flexible antenna structure shown in FIG. 61.
Figure 64:
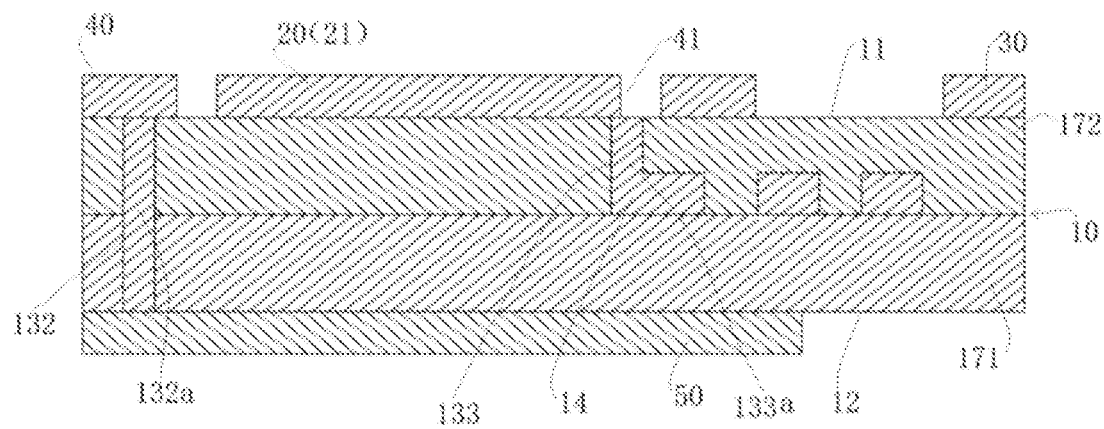
FIG. 64 is a cross-section view of the flexible antenna structure shown in FIG. 61 along line C-C.
Figure 65:
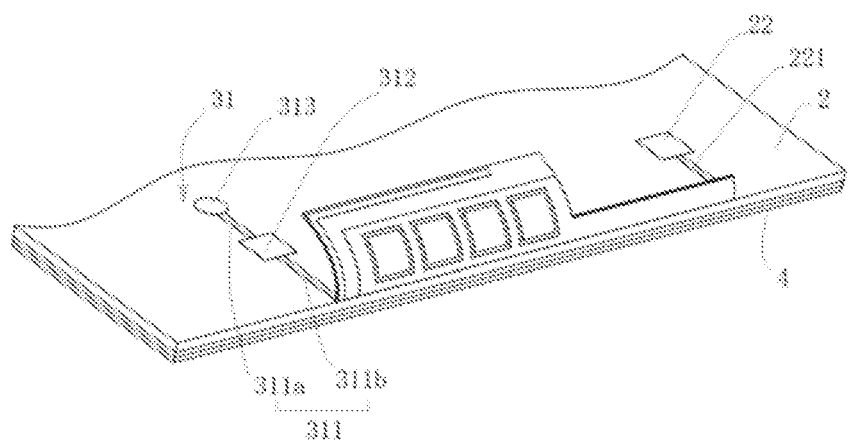
FIG. 65 is a schematic view after a shell is removed from an electronic device having the flexible antenna structure shown in FIG. 61.
Figure 66:
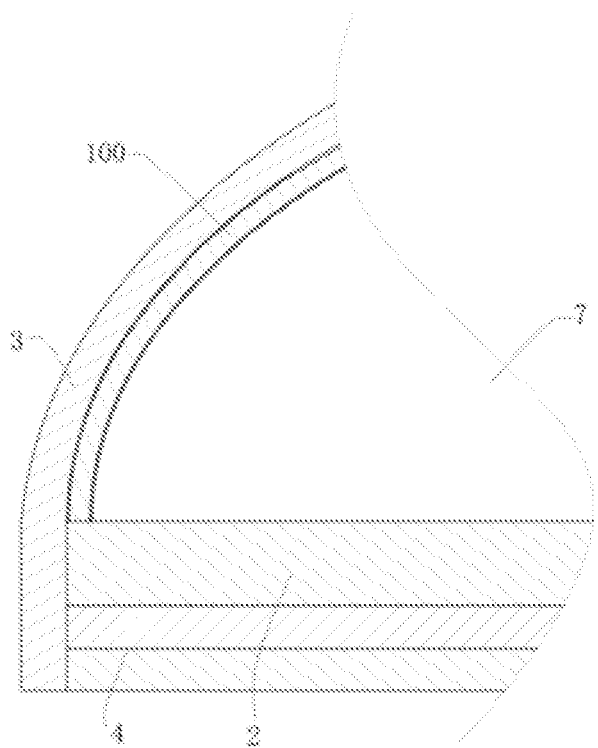
FIG. 66 is a cross-section view of the electronic device shown in FIG. 65.

Referring to FIG. 61 to FIG. 66, FIG. 61 is a schematic view of a flexible antenna structure 100 disclosed in Embodiment X of the present disclosure; FIG. 62 is a schematic view from another angle of the flexible antenna structure 100 shown in FIG. 61; FIG. 63 is a schematic view of electrical connection between a mm-Wave antenna 20 and a conductive line 14 of the flexible antenna structure 100 shown in FIG. 61; FIG. 64 is a cross-section view of the flexible antenna structure 100 shown in FIG. 61 along line C-C; FIG. 65 is a schematic view after a shell 1 is removed from an electronic device 200 having the flexible antenna structure 200 shown in FIG. 61; and FIG. 66 is a cross-section view of the electronic device 200 shown in FIG. 65. The solutions of the flexible antenna structure 100 and the electronic device 200 in the present embodiment are basically the same as those in Embodiment I, and parts, which are the same as those in Embodiment I, of the present embodiment X are not described in detail. Differences of the flexible antenna structure 100 and the electronic device 200 in the present embodiment X will be mainly described.

In Embodiment X, the position of the extension part 16 is different from that in Embodiment I. The extension part 16 is connected to one side of the main body part 15. One edge of the extension part 16 is colinear with one edge of the main body part 15 so that the flexible printed circuit board 10 is approximately L-shaped, and a routing manner of the conductive line 14 is also different from that in Embodiment I. During assembling of the flexible antenna structure 100, the colinear edges of the extension part 16 and the main body part 15 may be disposed on the main circuit board 2. The flexible antenna structure 100 may be located on an inner surface of the shell 1 and conformal with the shell 1, so that the space utilization rate is increased within a limited space. Furthermore, the size and cost of the entire machine will not be increased, and the competitiveness of the product is improved.

Embodiment XI

Figure 67:
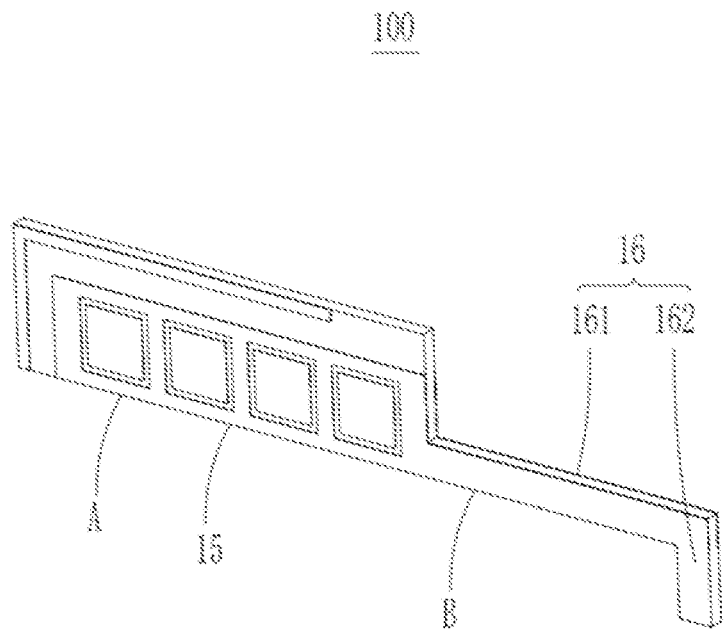
FIG. 67 is a schematic view of a flexible antenna structure disclosed by Embodiment XI of the present disclosure.
Figure 68:
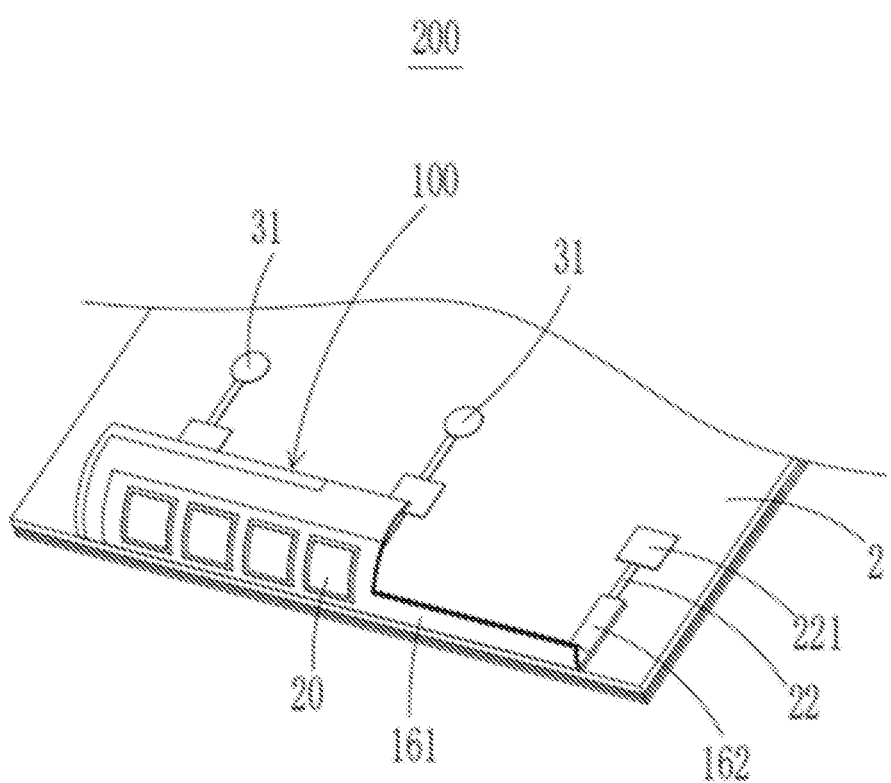
FIG. 68 is a schematic view after a shell is removed from an electronic device having the flexible antenna structure shown in FIG. 67.

Referring to FIG. 67 and FIG. 68, FIG. 67 is a schematic view of a flexible antenna structure 100 disclosed by Embodiment XI of the present disclosure; and FIG. 68 is a schematic view after a shell is removed from an electronic device 200 having the flexible antenna structure 100 shown in FIG. 67. The solutions of the flexible antenna structure 100 and the electronic device 200 in the present embodiment XI are basically the same as those in Embodiment X. Parts, which are the same as those in the solutions in Embodiment X, in the solutions of the flexible antenna structure 100 and the electronic device 200 in the present embodiment XI are not repeatedly described. Descriptions of differences of the flexible antenna structure 100 and the electronic device 200 in the present embodiment will be emphasized.

In Embodiment XI, the flexible printed circuit board 10 includes a main body part 15 and an extension part 16. The extension part 16 includes a first extension part 161 and a second extension part 162; the first extension part 161 is connected with one end of the main body part 15; the second extension part 162 is connected with the first extension part 161 and is used to be electrically connected to the mm-Wave RFIC 22; a first edge A of the main body part 15 located on a first side F of the flexible printed circuit board 10 and a second edge B of the first extension part 161 located on the first side F are collinear; a width of the first extension part 161 in a direction perpendicular to the second edge B is less than a width of the main body part 15 along the first edge A; and the second extension part 162 and the first extension part 161 are connected in a bent manner. By means of the foregoing design, the main body part 15 and the first extension part 161 can be disposed on the inner side of a shell of the electronic device 200 to achieve a good radiation effect. The first edge A and the second edge B can be disposed in a manner of corresponding to a surface of a main circuit board 2 in the shell; and the second extension part 162 can bend to be superposed with the surface of the main circuit board 2 relative to the first extension part 161, so as to be electrically connected to the main circuit board 2 and then electrically connected, via a feeder line 221 on the main circuit board 2, to the mm-Wave RFIC 22 located on the main circuit board 2. The above-mentioned structure is convenient for the arrangement of the flexible antenna structure 100, so that the flexible antenna structure can guarantee the radiation effect, is also convenient to assemble, and has relatively high space utilization rate, thus reducing the overall size and cost and improving the comprehensive competitiveness of the product. In addition, it can be understood that in a change embodiment, the specific structure of the extension part 16 of the flexible printed circuit board 10 of Embodiment IX can also be applied to any embodiment from I to VIII to achieve the technical effects of facilitating the arrangement of the flexible antenna structure 100, facilitating electric connection with the mm-Wave RFIC 22 and reducing the overall size and cost. Descriptions thereof are omitted here.

In addition, in the various embodiments of the present disclosure, there can be a variety of methods for electrically connecting the flexible antenna structure 100 with the non-mm-Wave antenna feed source assembly 31 and the mm-Wave RFIC 22 on the main circuit board 2. For example, the extension part 16 of a wiring pad of the flexible antenna structure 100 can be enabled to partially bend or extend to a wiring pad of the main circuit board 2 and is connected by solder paste or other soldering fluxes. The wiring pad of the flexible antenna structure 100 and the wiring pad of the main circuit board 2 can also be electrically connected through other wires, other flexible printed circuit boards or a connector, as long as the non-mm-Wave antenna 30 of the flexible antenna structure 100 can be electrically connected to the non-mm-Wave antenna feed source assembly 31 and the mm-Wave antenna 20 can be electrically connected to the mm-Wave RFIC 22. The specific structure of the extension part 16 of the foregoing Embodiment X and Embodiment XI may also be applied to the structure in Embodiment I to IX. The above various embodiments and change embodiments are only the embodiments of the present disclosure, and do not constitute a limitation to the present invention. In addition, the extension part 16 of the foregoing Embodiment X and Embodiment XI is electrically connected to the mm-Wave RFIC 22 via the feeder line 221 on the main circuit board 2. In the various embodiments from I to IX of the present invention, the extension part 16 is directly electrically connected to the mm-Wave RFIC 22 on the main circuit board 2. However, in the change embodiments of Embodiments I to IX, the extension part 16 may also be electrically connected to the mm-Wave RFIC 22 via a wire (such as the feeder line 221 shown in Embodiments X and XI) on the main circuit board 2.

The electronic devices disclosed in the embodiments of the present disclosure are described in detail above. Specific examples are used here to illustrate the principle and implementation mode of the present disclosure. The descriptions of the above embodiments are only used to help understand the electronic device and its key thoughts of the present disclosure. Moreover, for those of ordinary skill in the art, according to the ideas of the present disclosure, there will be changes in the specific implementation modes and the scope of application. In summary, the content of the present specification should not be construed as limiting the present disclosure.

What is claimed is:

1. A flexible antenna structure, comprising:
    a flexible printed circuit board;
    a mm-Wave antenna disposed on the flexible printed circuit board and conformal with the flexible printed circuit board;
    a non-mm-Wave antenna disposed on the flexible printed circuit board and conformal with the flexible printed circuit board,
    wherein the flexible printed circuit board comprises a first surface and a second surface located on a side opposite to the first surface,
    the non-mm-Wave antenna comprises a first non-mm-Wave antenna unit and a second non-mm-Wave antenna unit; the first non-mm-Wave antenna unit and the mm-Wave antenna are disposed on the first surface and are independent of each other by a distance; and the second non-mm-Wave antenna unit is disposed on the second surface.

2. The flexible antenna structure according to claim 1, wherein along a direction from the first surface to the second surface, the mm-Wave antenna at least partially overlaps at least part of the non-mm-Wave antenna.

3. The flexible antenna structure according to claim 1, wherein at least part of the non-mm-Wave antenna located on the second surface is used to be electrically connected to at least two non-mm-Wave antenna feed source assemblies and grounded.

4. The flexible antenna structure according to claim 1, wherein the first non-mm-Wave antenna unit has at least one opening region, and the mm-Wave antenna is located in the opening region.

5. The flexible antenna structure according to claim 1, wherein the flexible antenna structure further comprises a first conductive layer that is disposed on the first surface and comprises at least one opening region; and the mm-Wave antenna is arranged in the opening region.

6. The flexible antenna structure according to claim 5, wherein the number of the at least one opening region is multiple; the mm-Wave antenna comprises a plurality of mm-Wave antenna units; and the plurality of mm-Wave antenna units are respectively arranged in the plurality of opening regions.

7. The flexible antenna structure according to claim 1, the first non-mm-Wave antenna unit and the second non-mm-Wave antenna unit are electrically connected through a via hole running through the flexible printed circuit board.

8. The flexible antenna structure according to claim 5, wherein the flexible antenna structure further comprises a second conductive layer which is disposed on the second surface and used for being grounded.

9. The flexible antenna structure according to claim 1, wherein the flexible printed circuit board comprises a main body part and an extension part connected to one side of the main body part; a width of the extension part in a preset direction is less than a width of the main body part in the preset direction; the mm-Wave antenna is disposed on the main body part and is used to be electrically connected to a mm-Wave radio-frequency integrated circuit through the extension part; and the non-mm-Wave antenna is located on the main body part.

10. The flexible antenna structure according to claim 9, wherein the main body part comprises a middle region, a first region connected to one side of the middle region, and a second region connected to the other side of the middle region; the extension part is connected to the middle region; the main body part has a rectangular planar shape, and the extension part has a rectangular planar shape; the main body part and the extension part are perpendicularly connected into a T shape; and a joint of at least one of the first region and the second region and the middle region has an opening part.

11. The flexible antenna structure according to claim 9, wherein mm-Wave radio-frequency integrated circuit the extension part comprises a first extension part and a second extension part; the first extension part is connected with one end of the main body part; the second extension part is connected with the first extension part and is used to be electrically connected to the mm-Wave radio-frequency integrated circuit; a first edge of the main body part located on a first side of the flexible printed circuit board and a second edge of the first extension part located on the first side are collinear; a width of the first extension part in a direction perpendicular to the second edge is less than a width of the main body part along the first edge; and the second extension part and the first extension part are connected in a bent manner.

12. An electronic device, comprising a shell, a main circuit board located in the shell, and the flexible antenna structure according to claim 1, wherein the main circuit board is provided with a non-mm-Wave antenna feed source assembly and a mm-Wave radio-frequency integrated circuit; the shell comprises a bent part; the flexible antenna structure is disposed on the bent part and is conformal with the bent part; the flexible antenna structure is further electrically connected with the main circuit board, so that the mm-Wave antenna is electrically connected with the mm-Wave radio-frequency integrated circuit; and the non-mm-Wave antenna is electrically connected with the non-mm-Wave antenna feed source assembly.

13. A flexible antenna structure, comprising:
a flexible printed circuit board;
a mm-Wave antenna disposed on the flexible printed circuit board and conformal with the flexible printed circuit board;
a non-mm-Wave antenna disposed on the flexible printed circuit board and conformal with the flexible printed circuit board,
wherein the flexible printed circuit board comprises a first surface and a second surface located on a side opposite to the first surface,
the non-mm-Wave antenna comprises a first non-mm-Wave antenna unit and a second non-mm-Wave antenna; the mm-Wave antenna is disposed on the first surface; and the first non-mm-Wave antenna unit and the second non-mm-Wave antenna unit are independent of each other and are disposed on the second surface at an interval.

* * * * *